(12) United States Patent
Takahashi et al.

(10) Patent No.: US 10,600,614 B2
(45) Date of Patent: Mar. 24, 2020

(54) STAGE DEVICE AND CHARGED PARTICLE BEAM DEVICE

(71) Applicant: Hitachi High-Technologies Corporation, Tokyo (JP)

(72) Inventors: Motohiro Takahashi, Tokyo (JP); Masaki Mizuochi, Tokyo (JP); Shuichi Nakagawa, Tokyo (JP); Tomotaka Shibazaki, Tokyo (JP); Hironori Ogawa, Tokyo (JP); Naruo Watanabe, Tokyo (JP); Takanori Kato, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 16/122,189

(22) Filed: Sep. 5, 2018

(65) Prior Publication Data

US 2019/0103246 A1 Apr. 4, 2019

(30) Foreign Application Priority Data

Sep. 29, 2017 (JP) .................................. 2017-189403
Apr. 27, 2018 (JP) .................................. 2018-086043

(51) Int. Cl.
*H01J 37/20* (2006.01)
*H01J 37/26* (2006.01)
*H01J 37/22* (2006.01)

(52) U.S. Cl.
CPC .............. *H01J 37/20* (2013.01); *H01J 37/22* (2013.01); *H01J 37/261* (2013.01); *H01J 2237/20207* (2013.01); *H01J 2237/20221* (2013.01); *H01J 2237/20292* (2013.01); *H01J 2237/2482* (2013.01)

(58) Field of Classification Search
CPC ............. H01J 37/20; H01J 2237/20221; H01J 2237/20292; H01J 2237/2007; H01J 2237/20228; H01J 2237/20264; H01J 37/22; H01J 37/244; G03F 7/70775; G03F 7/70716; G03F 7/7015; G03F 7/707; G03F 9/7003; H01L 21/68; H01L 21/681; G01B 11/0675; G01B 11/0608; G01B 9/02
USPC .............. 250/442.11, 491.1, 441.11, 453.11; 355/53, 77; 356/500, 399, 400, 493, 498, 356/510
See application file for complete search history.

(56) References Cited

U.S. PATENT DOCUMENTS 6,208,407 B1 * 3/2001 Loopstra ............. G03F 7/70716
355/53
6,331,885 B1 * 12/2001 Nishi .................. G03F 7/70358
355/53

(Continued)

FOREIGN PATENT DOCUMENTS

JP 3890233 B1 3/2007

*Primary Examiner* — David A Vanore
(74) *Attorney, Agent, or Firm* — Mattingly & Malur, PC

(57) ABSTRACT

The present invention is to provide a stage device capable of improving field-of-view positioning accuracy of a stage having a Z-axis mechanism. The invention is directed to a sample stage device having a first table that moves a sample in a first direction, a second driving mechanism that moves the first table in a second direction different from the first direction, and a part having a function of moving a laser interferometer optical axis that measures the position of the first table, in the second direction.

17 Claims, 20 Drawing Sheets

(56) References Cited

U.S. PATENT DOCUMENTS

| Patent/Pub No. | Date | Inventor | Classification |
|---|---|---|---|
| 6,538,719 B1* | 3/2003 | Takahashi | G03F 7/70358 355/53 |
| 6,720,680 B1* | 4/2004 | Tanaka | G03F 7/70725 310/12.19 |
| 6,762,412 B1* | 7/2004 | Akagawa | G03F 7/70833 250/363.07 |
| 6,842,248 B1* | 1/2005 | Binnard | G03F 7/70775 355/53 |
| 7,027,131 B2* | 4/2006 | Terashima | G03F 7/70716 355/72 |
| 7,355,719 B2* | 4/2008 | Schluchter | G03F 7/70775 356/493 |
| 7,499,180 B2* | 3/2009 | Hattori | G03F 7/70775 356/510 |
| 8,902,405 B2* | 12/2014 | Ito | G01B 9/02 355/53 |
| 9,316,917 B2* | 4/2016 | Arai | G03F 7/70775 |
| 9,714,825 B2* | 7/2017 | Marx | G01B 9/02004 |
| 2004/0041101 A1* | 3/2004 | Akutsu | H01J 37/3045 250/491.1 |
| 2006/0033903 A1* | 2/2006 | Yuan | G03F 7/70725 355/72 |
| 2006/0215138 A1* | 9/2006 | Liu | G03F 7/70383 355/55 |
| 2007/0139656 A1* | 6/2007 | Wan | G01B 11/0675 356/504 |
| 2007/0229791 A1* | 10/2007 | Inoue | G01B 11/0608 355/67 |
| 2007/0295140 A1* | 12/2007 | Fujita | B82Y 10/00 74/490.09 |
| 2008/0111978 A1* | 5/2008 | Shibuta | G03F 7/70341 355/30 |
| 2008/0158531 A1* | 7/2008 | Kiuchi | G03B 27/42 355/53 |
| 2012/0305766 A1* | 12/2012 | Tanaka | H02K 41/031 250/310 |
| 2014/0312246 A1* | 10/2014 | Takahashi | H01J 37/20 250/453.11 |
| 2014/0327183 A1* | 11/2014 | Mori | G03F 7/0002 264/293 |
| 2015/0248991 A1* | 9/2015 | Ogawa | H01J 37/20 250/491.1 |
| 2015/0279613 A1* | 10/2015 | Ogawa | H01J 37/20 250/442.11 |
| 2015/0340198 A1* | 11/2015 | Nakagawa | H01J 37/20 250/441.11 |
| 2016/0005568 A1* | 1/2016 | Mizuochi | H01J 37/20 250/442.11 |
| 2016/0061689 A1* | 3/2016 | Morley | G02C 7/04 356/496 |
| 2016/0284506 A1* | 9/2016 | Ogawa | H01J 37/20 |
| 2016/0365219 A1* | 12/2016 | Nishioka | H01J 37/20 |
| 2017/0061947 A1* | 3/2017 | Mutou | H01J 37/16 |
| 2018/0247855 A1* | 8/2018 | Takahashi | H01L 21/68 |
| 2019/0108970 A1* | 4/2019 | Kato | H01J 37/147 |
| 2019/0228947 A1* | 7/2019 | Takahashi | B23Q 1/72 |
| 2019/0252151 A1* | 8/2019 | Kato | H01J 37/04 |
| 2019/0259567 A1* | 8/2019 | Takahashi | H01J 37/20 |

* cited by examiner

STAGE DEVICE AND CHARGED PARTICLE BEAM DEVICE

CLAIM OF PRIORITY

The present application claims priority from Japanese Patent Application JP 2017-189403 filed on Sep. 29, 2017 and Japanese Patent Application JP 2018-086043 filed on Apr. 27, 2018, the content of which are hereby incorporated by references into this application.

TECHNICAL FIELD

The present invention relates to a stage device and a charged particle beam device, and more particularly, to a structure for suppressing an Abbe error of a stage and a positioning error due to table deformation caused by a guide.

BACKGROUND ART

In a charged particle beam device such as an electron microscope used for manufacturing, measuring, and inspecting semiconductor wafers, a stage for moving the position of a sample is provided to radiate beams onto a desired position of the sample. Such a stage is provided with a driving mechanism for moving the sample in at least two directions so as to move the sample in a two-dimensional direction. Further, a laser interferometer is generally used to measure the position of the stage.

PTL 1 discloses a stage device that measures the inclination of a table and corrects a measurement error according to the inclination. More specifically, in PTL 1, in addition to an interferometer that measures the horizontal position of a mirror fixed to the table, two interferometers are installed to measure the inclination of the mirror by measuring two points spaced apart from each other in a height direction. According to such a configuration, it is possible to reduce the measurement error caused by the inclination of the stage.

CITATION LIST

Patent Literature

PTL 1: Japanese Patent No. 3890233 (corresponding to U.S. Pat. No. 7,499,180)

SUMMARY OF INVENTION

Technical Problem

According to the configuration disclosed in PTL 1, it is possible to reduce a measurement error caused by the inclination of a stage in the stage operating in a horizontal plane (in two axes of XY), but it is necessary to add an interferometer, thus leading to an increase in cost. Further, for the purpose of measuring the inclination, it is necessary to measure two points of the mirror with different heights, and it is necessary to increase the height of the mirror. Furthermore, in the stage of performing positioning also in a vertical direction (Z direction), it is necessary to further increase the height of the mirror according to an operating stroke in the Z direction. Expansion of the mirror further leads to an increase in cost, and leads to an increase in movable mass of the stage, an increase in vibration of the mirror due to a stage movement, and an increase in positioning error due to thermal deformation caused by the increased heat generation of the motor.

Hereinafter, there are provided a stage device and a charged particle beam device that are intended to achieve both a reduction in Abbe error and a reduction of mirror weight.

Solution to Problem

In order to accomplish the object, according to the first aspect, there are provided a stage device and a charged particle beam device, the stage device provided with a table loaded with a sample, a first driving mechanism that moves the table in an X direction, a mirror mounted on the table, and a laser interferometer that radiates a laser beam towards the mirror and receiving reflected light from the mirror to measure a position of the table in the X direction, the stage device including a second driving mechanism that moves the table in a Z direction, and an optical axis moving mechanism that moves an optical axis of the laser interferometer in the Z direction.

Advantageous Effects of Invention

According to the above-described configuration, it is possible to provide a stage device and a charged particle beam device that enable both a reduction in Abbe error and a reduction of mirror weight.

DESCRIPTION OF EMBODIMENTS

Figure 1:
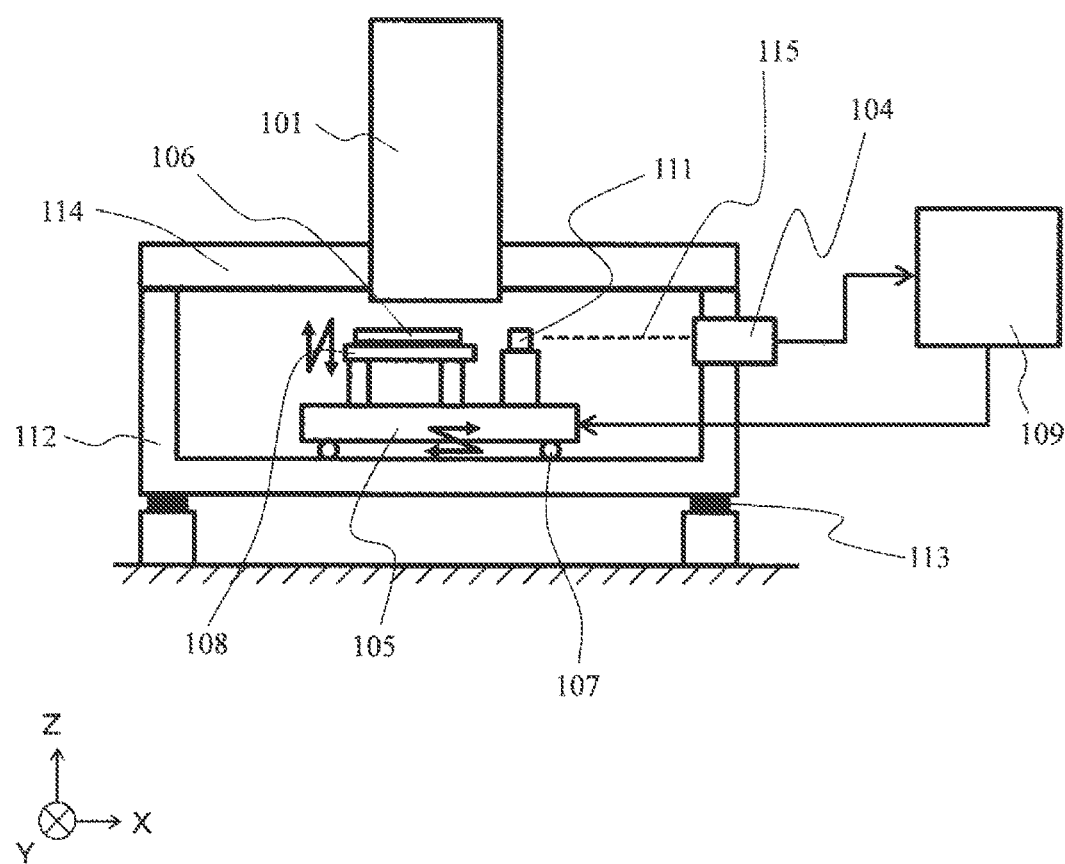
FIG. 1 is a view illustrating the configuration of a charged particle beam device.

Recently, with the miniaturization of semiconductor elements, inspection devices and measuring devices as well as manufacturing devices are required to have high positioning accuracy. For example, in order to search for a desired inspection point, an SEM image of a pattern on a wafer is acquired with reference to the position coordinate of a stage. Even when there is a positioning error on the stage, if a position deviation from a target value of the wafer may be accurately measured, the position deviation of the stage may be corrected and a desired pattern may be measured by deflecting an electron beam. However, when the position deviation from the target value of the wafer may not be measured accurately, an error occurs in the correction of the electron beam, so that it is impossible to radiate the electron beam onto a desired position of the pattern, thus consequently causing a field-of-view positioning error. Thus, a distance between the pattern position of an observation target and a position onto which the electron beam is radiated after correcting the deviation of the stage position is referred to as a field-of-view positioning error. As a fine pattern of a device is formed, it becomes difficult to reach a desired inspection point if a field-of-view positioning error occurs.

Here, when there is a difference in height between the laser optical axis and an observation surface on an upper surface of the wafer, an Abbe error occurs according to a change in inclination of a table. Further, in order to reduce the field-of-view positioning error, it is important to reduce the positioning error due to the table deformation, as well as the above-described Abbe error. The table deformation is caused by the thermal deformation of the table, the passage of a rolling element of a guide, and the shape error of the guide. The table deformation is closely related to the optical axis height of a laser interferometer as well as the Abbe error, so that the optical axis is moved to an ideal height in the stage which is equipped with a Z axis mechanism to move a sample up and down, and thereby it is possible to improve field-of-view positioning accuracy. Further, the field-of-view misalignment caused by the thermal deformation may be solved by reducing a movable mass of the stage and minimizing the heat generation of a motor.

Therefore, it will be considered that the influence of the Abbe error and the table deformation can be reduced and the field-of-view positioning accuracy can be improved, without increasing the movable mass of the stage.

In a charged particle beam device having a stage that may carry a wafer, it is possible to reduce the measurement position error by measuring the inclination of the table (pitch measurement). However, in order to correct the measurement position error, it is necessary to mount a plurality of interferometers, which leads to increases in mirror mass and cost therefor. Furthermore, in the case of the stage moving in the Z direction, it is necessary to increase a mirror height by a Z-axis stroke, which likewise leads to an increase in mirror mass. If the mirror size increases, it is necessary to increase the table size to support the mirror, which leads to a significant increase in movable mass of the stage. As a result, the heat generation of the motor on the stage increases, and positioning accuracy deteriorates due to thermal deformation. Further, the vibration of a column and a sample chamber at the time of moving the stage increases, and it is required to extend a waiting time for attenuating the vibration after the movement, thus making it difficult to improve a throughput. Furthermore, if the mirror size increases, it is necessary to increase the size of the sample chamber for accommodating the mirror, thus leading to an increase in size of the device and an increase in manufacturing cost.

In the structure exemplified in embodiments described later, parts are added to an interferometer portion outside the sample chamber, and the Abbe error may be eliminated without increasing the movable mass of the stage.

Hereinafter, a stage structure for suppressing the Abbe error without increasing the size of the stage and the movable mass, and for improving the field-of-view positioning accuracy in the case of the charged particle beam device, for example, will be described.

In the following embodiments, a sample stage device having an XYZ mechanism for mainly supporting the sample and moving the sample in the XYZ direction, or an XZ mechanism for moving the sample in the XZ direction, and having the function of moving the optical axis of the laser interferometer for measuring the X direction or the XY direction, in the Z direction, and a charged particle beam device will be described.

This configuration enables both the reduction in weight of the stage and the reduction in field-of-view positioning error. Further, in the stage device having the positioning mechanism in the X-Y-Z direction, it is possible to minimize the field-of-view misalignment due to the Abbe error and deformation even when the Z mechanism is fixed at any position, and to improve the field-of-view positioning accuracy.

Embodiment 1

The following embodiment relates to the stage device having the structure of moving the optical axis of the laser interferometer for measuring the position(s) of both or either of the X and/or Y direction(s) in the XYZ stage, in the Z direction. In the XY stage having the common Z mechanism, since the difference in height between the optical axis of the interferometer measuring the X and Y directions and the sample positioned by the Z mechanism varies depending on the position of the Z mechanism, the Abbe error increases or decreases.

When it is necessary to secure high positioning accuracy both in the case where the sample is set at a high position and the case where the sample is set at a low position, the difference in height between the optical axis of the interferometer and the sample becomes large in either or both case(s) and the Abbe error becomes large, so it is difficult to increase the positioning accuracy in both cases.

The stage structure of the present invention is configured to move the optical axis of the interferometer of the stage up and down depending on the Z mechanism. This configuration allows the Abbe error to be always zero (0) even if the sample is positioned at any height by the Z mechanism, thus providing the stage structure having the high field-of-view positioning accuracy.

An example of the charged particle beam device will be described with reference to FIG. 1. Here, an example of a semiconductor measuring device (hereinafter, length measurement SEM) will be described as the example of the charged particle beam device. In the length measurement SEM, an electron optical system lens barrel 101 is mounted on a sample chamber 112, and the sample chamber 112 is supported by a vibration isolation mount 113. The electron optical system lens barrel 101 radiates an electron beam onto a wafer 106, captures a pattern on the wafer 106, and measures the line width of the pattern or evaluates shape accuracy. A stage having a table 105 as a movable part is mounted in the sample chamber 112, and a chuck 108 for mounting the wafer 106 as an observation target thereon is fixed to the table 105. The table 105 is configured to be moved by a driving mechanism such as a linear motor or a piezo actuator (not shown). In this embodiment, the stage device having a driving mechanism (first driving mechanism) for moving the table in the X direction, a driving mechanism (third driving mechanism) for moving the table in the Y direction, and a driving mechanism (second driving mechanism) for moving the table in the Z direction will be described.

Further, the table 105 is supported by a guide 107, the position of a mirror 111 is measured by a laser interferometer 104 to obtain a stage coordinate, and the positioning control is performed by a controller 109 (control device). As will be described later, the controller 109 supplies a signal to drive the Z mechanism (second driving mechanism), and also supplies a signal for adjusting the height of the laser optical axis of the laser interferometer to a mechanism for moving the optical axis, following the Z mechanism or depending on a selected mode.

If the table 105 is deformed, a relative distance between the chuck 108 and the mirror 111 fluctuates, and an image misalignment occurs when the position of an observation point on the wafer is managed by the laser length measurement value. However, if there is reproducibility in the laser length measurement value and the image misalignment including the deformation of the table, it is possible to create a correction map by recording the deviation amount of the image with respect to the coordinate. If the electron beam is shifted by the sum of the deviation amount of the image of this correction map and a difference between the current position measurement value of the stage and the target position, it is possible to make the field-of-view positioning error, caused by the reproducible deformation of the table, approach zero. However, in the case where the deformation of the table is not reproducible or a component having no reproducibility is incorporated, the field-of-view positioning error remains even if the correction map is used. In particular, in order to measure a device with a pattern spacing of several nanometers, it is required to reduce this field-of-view positioning error to an extreme.

Figure 2:
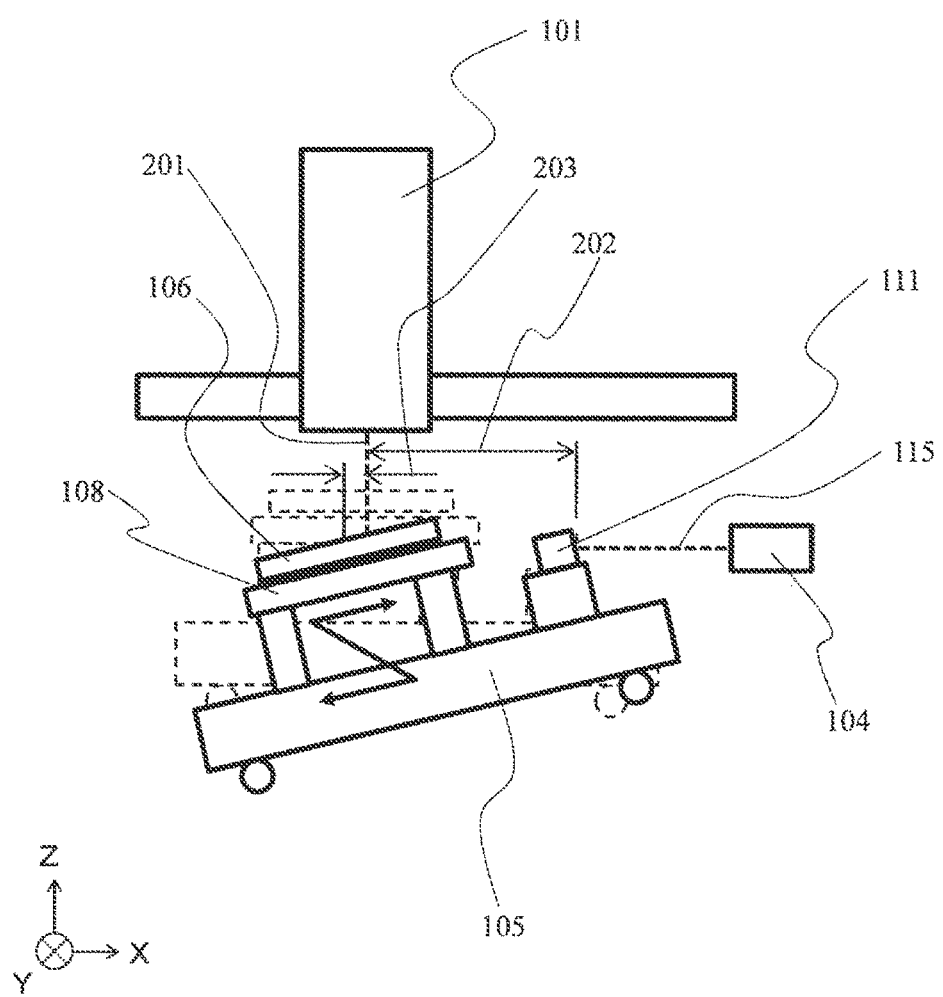
FIG. 2 is a view explaining a positioning error due to the inclination of a table.

Referring to FIG. 2, a schematic view explaining that the posture error of the table is correlated to the field-of-view positioning error is shown. The case where the table 105 is tilted from the state where the electron beam 201 is radiated onto the center of the wafer 106 is shown. When the table is tilted, even if the relative distance 202 in the X-axis direction between the mirror 111 and the electron beam 201 is not changed, the relative distance 202 in the X-axis direction between the mirror 111 and the observation point is changed, thus causing the image misalignment 203. In this way, when the inclination of the table changes, the distance in the horizontal direction between the mirror and the observation target point changes, which leads to the field-of-view positioning error.

The table may be tilted when the stage moves in the direction of +X as well as when the stage moves in the direction of −X. If the method of moving the stage in the +X direction is always employed to make this inclination constant, additional operations are required before observation, which leads to a reduction in throughput of the device. That is, it is necessary to adopt a method of fundamentally reducing the Abbe error.

Figure 3:
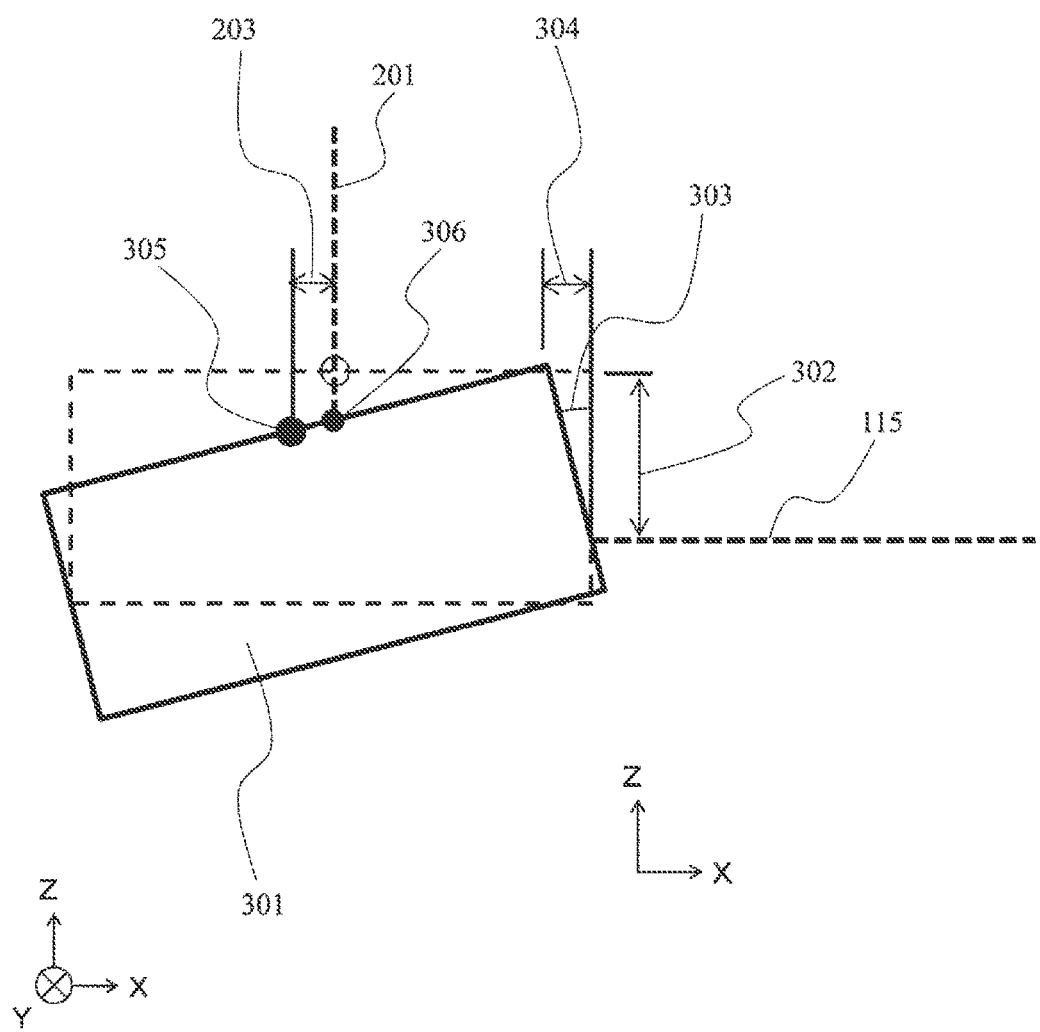
FIG. 3 is a view explaining the principle of generating an Abbe error.

Referring to FIG. 3, a view explaining the principle of generating the Abbe error is shown. Here, a model where the table, the sample, and the mirror are rigid bodies to form a rectangular parallelepiped 301 is employed. Assuming that the difference in height between the laser optical axis and the sample observation point is defined as A (302 in FIG. 3) and the inclination of the table is defined as $\varphi$ (303 in FIG. 3), the position misalignment D (203 in FIG. 3) of the observation point caused by the tilting of the table is expressed as $D = A \cdot \varphi$.

That is, if the inclination is constant, the position misalignment 203 increases in proportion to the height difference 302. In contrast, if the height of the observation surface and the height of the laser optical axis are set and the height difference 302 is set to zero, the position misalignment 203 due to the inclination may be made zero. For example, if the inclination is about 0.1 second and it is desired that the Abbe error is 1 nm or less, it is preferable that the height difference is about 2 mm or less.

Figure 4A:
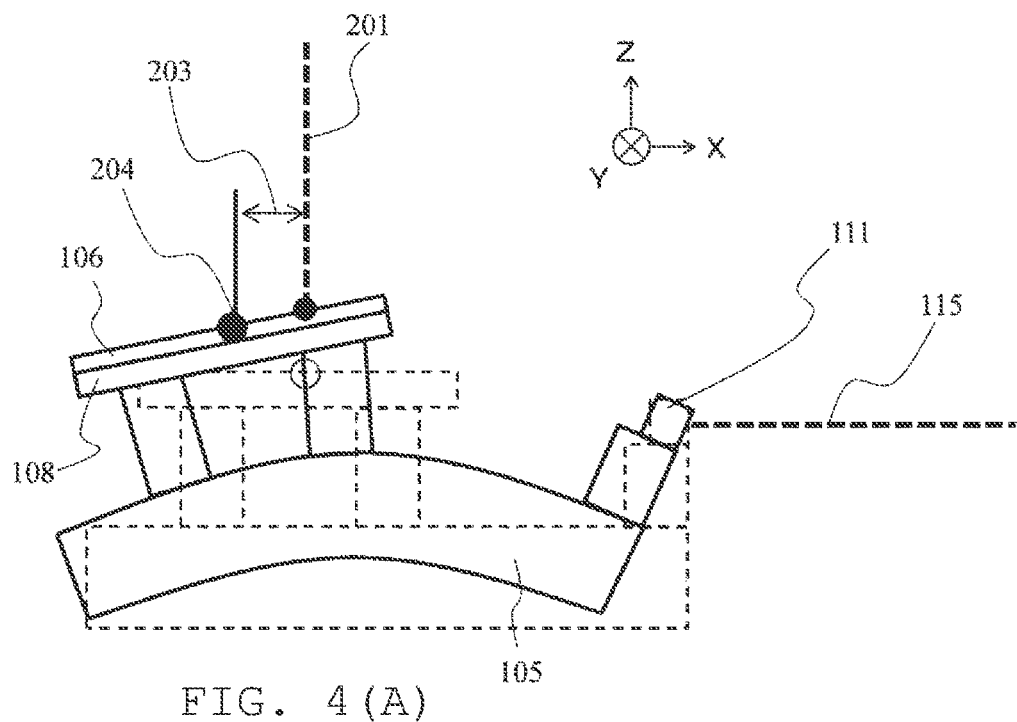
FIGS. 4(A) and 4(B) are views illustrating table deformation.

Referring to FIG. 4(A), a schematic view explaining that the table deformation leads to the field-of-view positioning error is shown. In the stage device, the table 105 on which the chuck or the mirror is mounted may be deformed by several factors. Examples of the factors may include the transfer of the distortion of a slider caused by the movement of a rolling element such as a roller or a ball of a rolling guide into and out from a bearing surface (hereinafter, referred to as distortion due to the passage of the rolling element), the deformation due to shape error of the guide, and the transfer of the warping of the guide due to atmospheric-pressure change or thermal deformation of the base or the sample chamber or a lower shaft table, etc. The deformation of the table 105 changes the relative distance between the mirror 111 and the chuck 108, and causes the position misalignment 201 between the observation target point on the wafer 106 and the electron beam 203, thus leading to field-of-view misalignment.

Figure 4B:
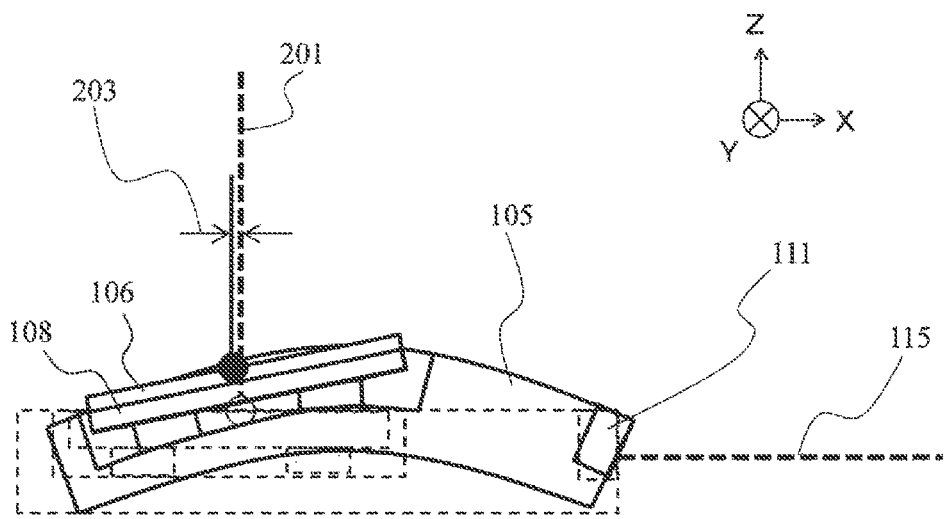

As illustrated in FIG. 4(B), it is possible to reduce the position misalignment 203 due to the table bending by measuring the center of the deformation of the table 105. However, when positioning in the Z direction, deformation increases so that the laser optical axis 115 and the bending center of the table 105 are displaced by the position of the Z mechanism. Also, depending on which Abbe error or deformation is larger, the balance of matching with the sample surface or matching the table bending center is considered, and it is effective to perform design at a height that minimizes the field-of-view positioning error.

Figure 5:
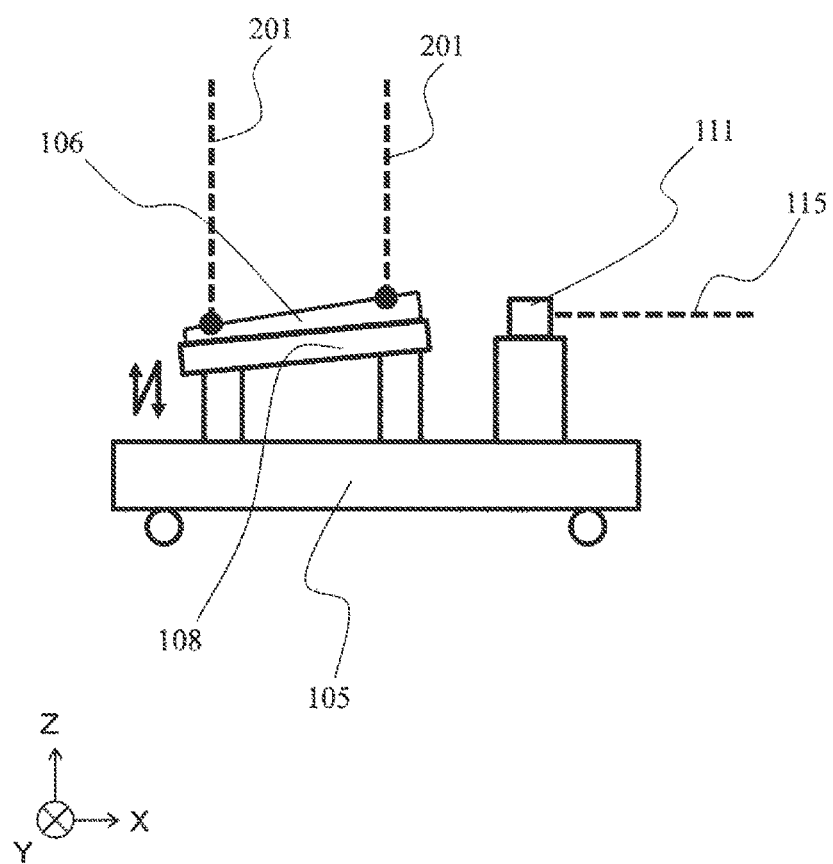
FIG. 5 is a view explaining wafer alignment for creating a correction map.

Referring to FIG. 5, a drawing explaining the step of creating the correction map by the wafer alignment and the principle of correcting the reproducible inclination is shown.

Strictly speaking, the chuck 108 also has an inclination, so that, when the chuck is moved up and down by the Z mechanism, the inclination of the chuck also changes each time the up and down movement occurs. Further, the wafer 106 is not constant in thickness and has an inclination. In order to compensate for the influence, a correlative map is created between the table position measured by the laser interferometer and the observation point of the wafer.

For example, two marks on the wafer are observed and then the deflection amount of the electron beam 201 and the value of the laser interferometer are stored. By creating the correction map using the stored values as a reference, it is possible to eliminate the influence of the reproducible inclination of the wafer and the thermal expansion in which the wafer uniformly expands. This operation is referred to as wafer alignment.

The reproducibility of the inclination of the Z mechanism does not cause a problem by performing the wafer alignment every time the wafer is loaded or every time the Z mechanism is operated.

Figure 6:
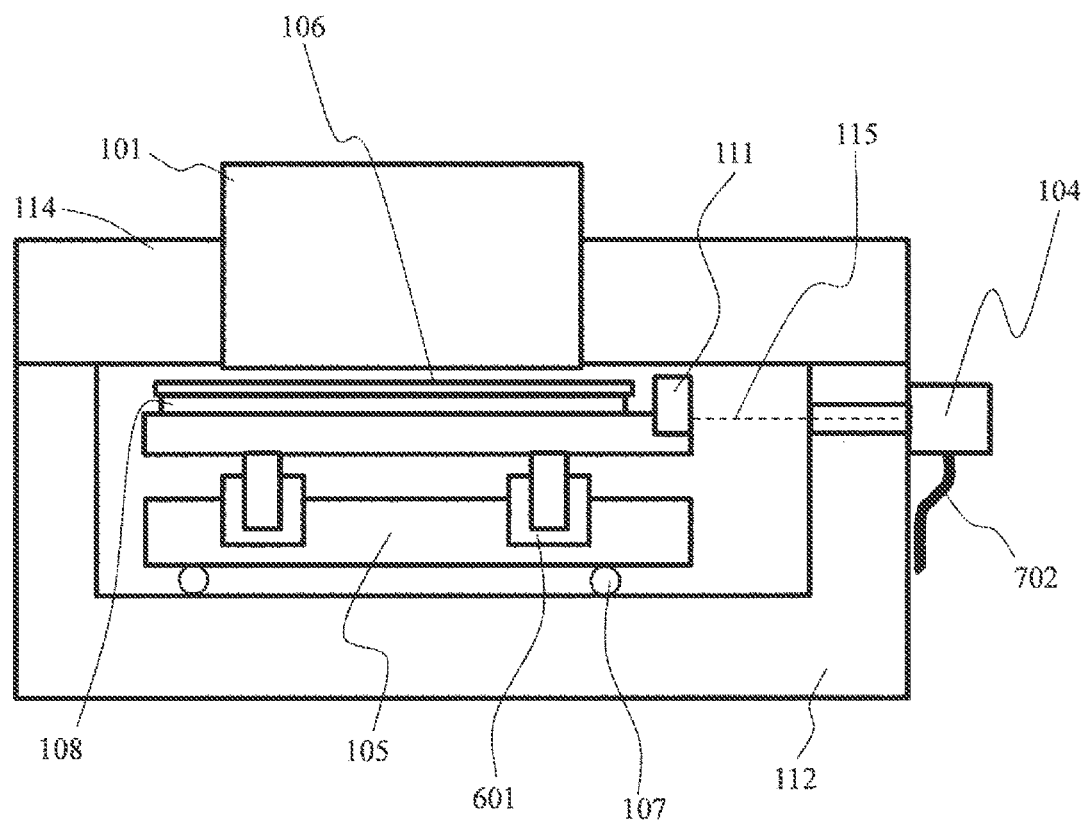
FIG. 6 is a view illustrating a configuration example of a stage equipped with a Z mechanism.

Referring to FIG. 6, an example of the stage on which the Z mechanism is mounted is shown. In this configuration example, the chuck 108 and the mirror 111 are integrally moved up and down by the Z mechanism 601. Further, the interferometer 104 is fixed to a side surface of the sample chamber 112.

By integrally placing the mirror 111 and the chuck 108 on the Z mechanism 601, it is possible to suppress relative vibration between the mirror and the chuck. By correcting the deflected amount of the electron beam depending on the position of the mirror, it is possible to correct the vibration of the table. In order to maximize the correction effect, it is effective to integrally operate the mirror and the chuck. However, in this example, it is necessary to increase the height by the stroke of the Z mechanism 601 to move the mirror 111 up and down with respect to the optical axis 115.

In this example, when the sample 106 moves down, the sample surface is equal in height to the optical axis 115. When the sample moves up, the optical axis is lower in height than the sample surface, so that the Abbe error increases. Further, as illustrated in FIG. 4(B), when the optical axis is aligned with the center of deformation of the table, the influence of deformation increases either in the case where the sample is at an upper position or the case where the sample is at a lower position, so that the field-of-view positioning error increases.

Figure 7:
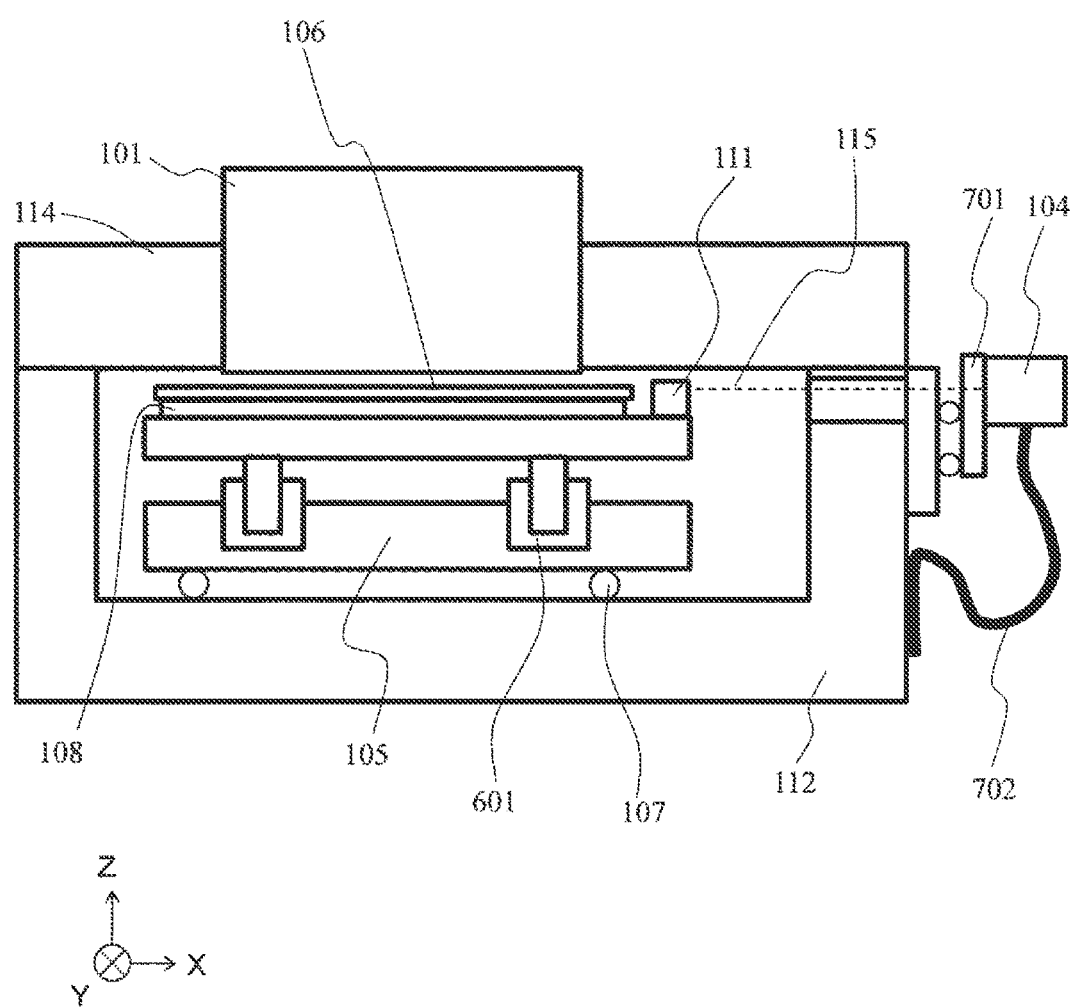
FIG. 7 is a view illustrating a configuration example of a stage of operating an interferometer.

Referring to FIG. 7, an example where the chuck and the mirror are movable together with the interferometer in a structure in which the chuck and the mirror are integrally moved up and down by the Z mechanism is shown.

The interferometer 104 is moved up and down by an interferometer driving mechanism 701 (optical-axis moving mechanism) having the guide. Further, the actuator for feeding a driving force to move the interferometer up and down employs an ultrasonic motor, and the power supply to the actuator is turned off after positioning the interferometer, thus preventing the actuator from being vibrated by power noise. In the ultrasonic motor, it is unnecessary to add a new support structure to retain holding force even when the power supply is turned off. On the contrary, by adopting a stopped support structure, it is also possible to use an actuator having no holding force other than the ultrasonic motor.

However, when the interferometer moves up and down, the mass of the interferometer is large, so that high rigidity is required for guiding from the viewpoint of vibration reduction, and thus high holding force is also required for the actuator. Therefore, the size of the device is increased. The guiding and the increase in size of the actuator lead to an increase in cost.

When the interferometer moves up and down, it is necessary to move a cable 702 of the interferometer. The cable of the interferometer may employ an optical fiber cable that guides the light from a light source to the interferometer, as a type in which a light source is arranged outside the interferometer to prevent heat generation, in addition to electric wiring. There are few cases where these cables are designed as movable cables, and reliability thereof is low in terms of the cable life.

Figure 8:
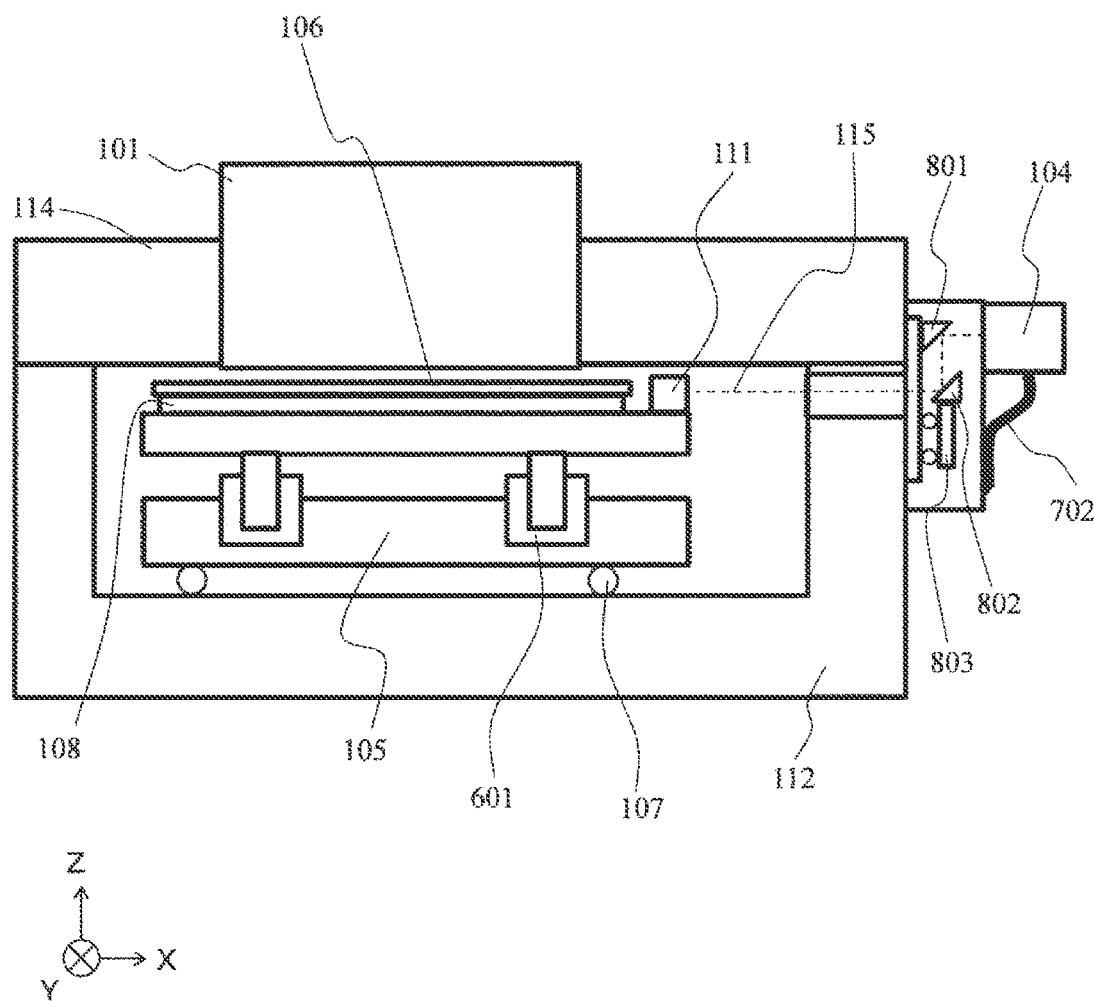
FIG. 8 is a view illustrating a configuration example of a stage of operating only a bender.

Referring to FIG. 8, an example where the interferometer is fixed and a bender is movable in a structure in which the chuck and the mirror are integrally moved up and down by the Z mechanism is shown. The example of the structure of FIG. 7 where the interferometer 104 moves up and down is problematic in that vibration is increased by the mass of the interferometer 104 and the cable life is shortened. However, according to this example, the interferometer 104 having a laser beam source is fixed and only the bender 802 (reflection member) that bends the optical axis, thus solving the problems. That is, the reflecting member is selectively moved so that the relative position in the Z direction of the reflection member changes with respect to the light source or the like.

In FIG. 8, a laser beam emitted from the interferometer may be once bent downward by a fixed bender 801 and then guided to the mirror fixed to the table by a movable bender 802.

Since the movable bender 802 is lighter as compared with the case where it is moved up and down together with the interferometer 104 even when it is combined with the guide movable part, it is possible to miniaturize a bender drive mechanism 803 including the guide and the actuator. Further, it is unnecessary for the bender 803 to pass through wires to be constituted by the mirror or prism, without affecting the cable life.

Figure 9:
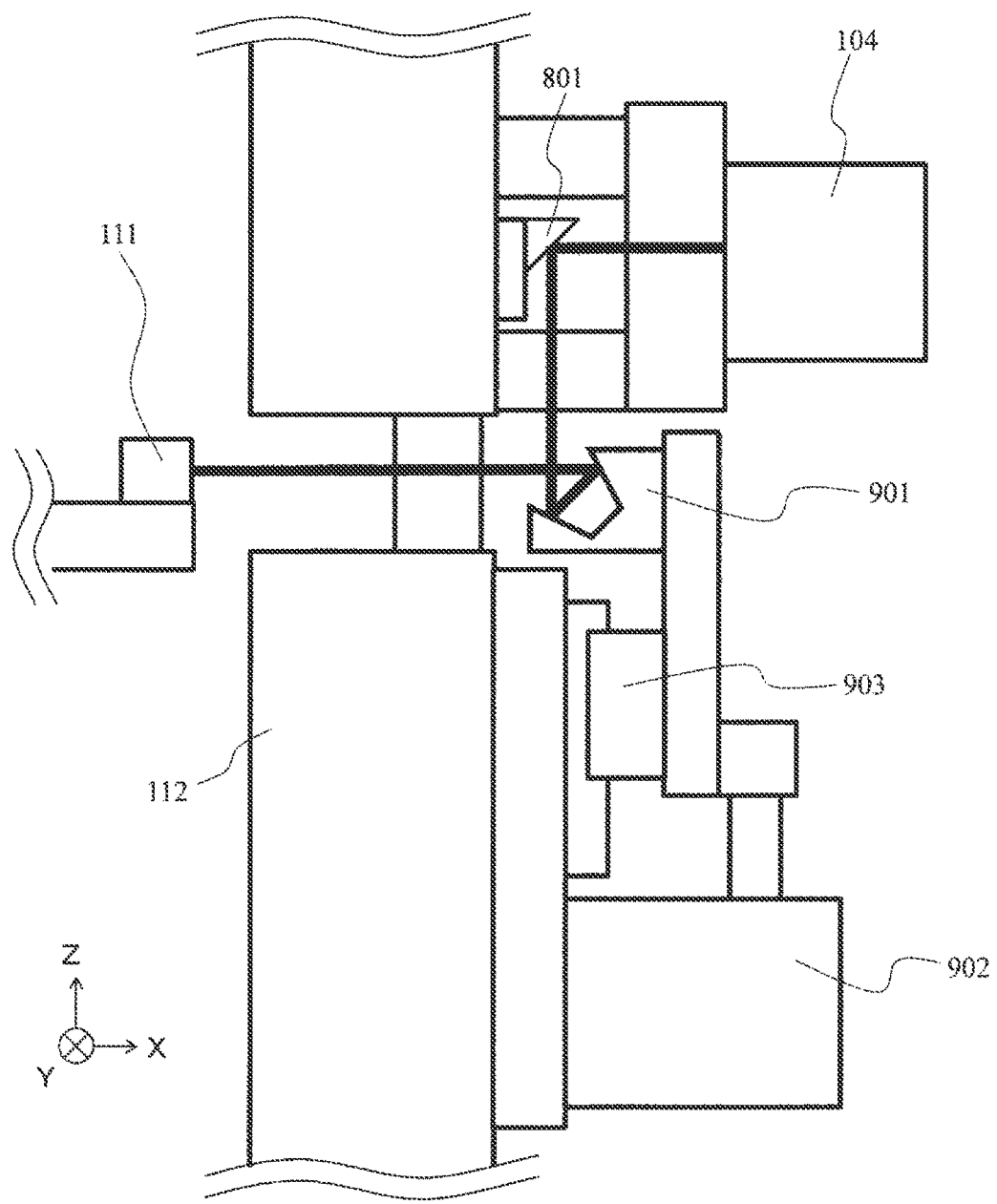
FIG. 9 is a view of a configuration example in which a penta-Dach mirror is applied to the movable bender.

Referring to FIG. 9, a configuration example where a penta-Dach mirror as the movable bender is applied to the bender movable structure of FIG. 8 is shown.

When a single mirror having a reflecting surface of 45 degrees with respect to the optical axis is applied to the movable bender 802 of FIG. 8, the movable bender 802 may be tilted and the optical axis 115 guided to the table may be tilted depending on the posture error of the guide for guiding the movable bender 802. If the optical axis misalignment increases, the ratio of S/N of the laser interferometer decreases and measurement noise increases. As a result, there is possibility that the positioning accuracy of the table is decreased.

In order to solve the problems, a penta-Dach mirror 901 is used as the movable bender, thus preventing the inclination of the axis of laser beam radiated onto the table from being changed even when the movable bender is tilted. The penta-Dach mirror 901 is guided by a guide 903 and movable in the Z direction. By an ultrasonic actuator 902, the driving force at the time of being moved in the Z direction and the holding force during stop are obtained.

Figure 10:
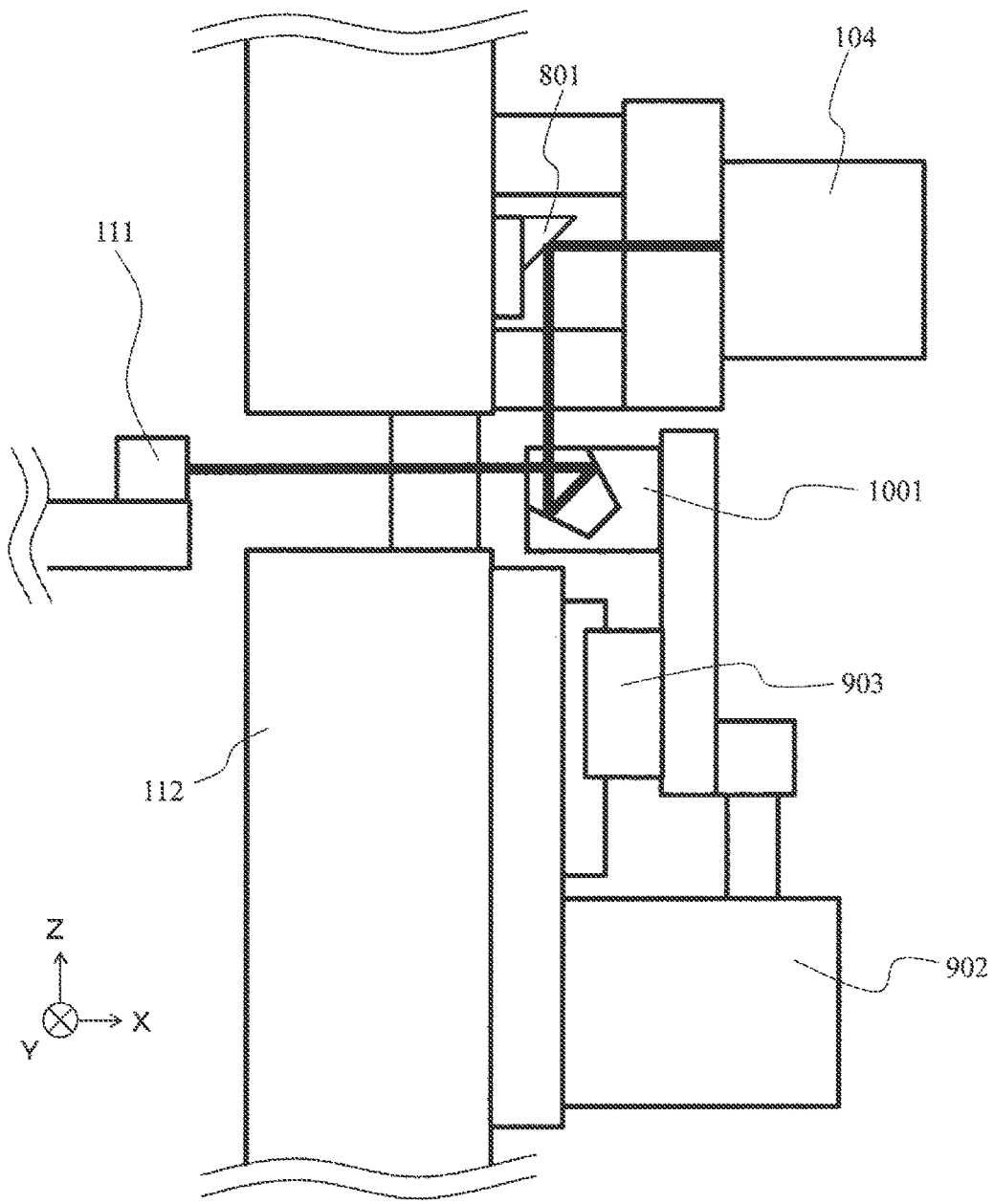
FIG. 10 is a view of a configuration example in which a penta-Dach prism is applied to the movable bender.

Referring to FIG. 10, a configuration example where a penta-Dach prism is applied to the movable bender of FIG. 9 is shown. As illustrated in FIG. 10, it is also possible to use the penta-Dach prism having the same function as the penta-Dach mirror for the movable bender.

Figure 11:
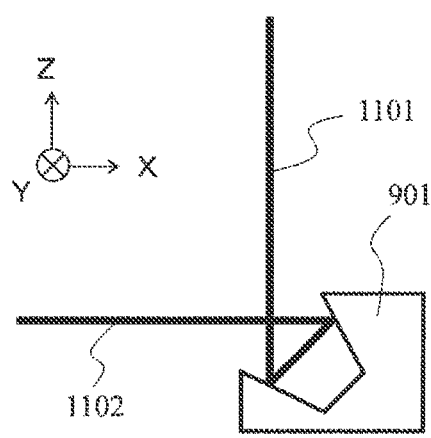
FIGS. 11(A1) to 11(B2) are views for explaining a change in an optical axis when the penta-Dach mirror tilts.
Figure 11:
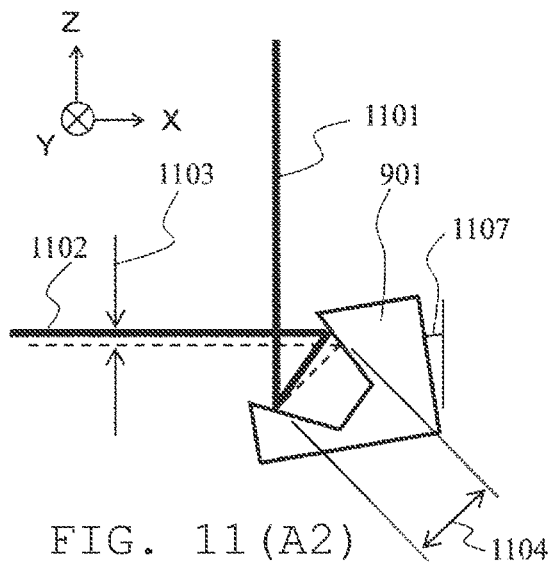
Figure 11:
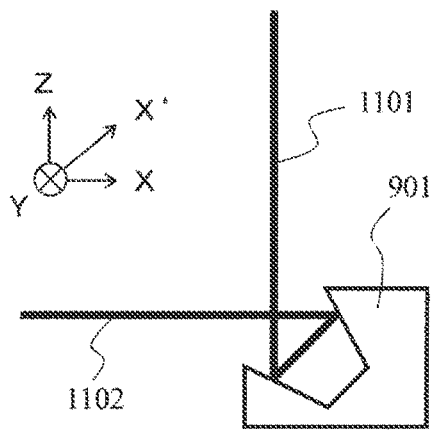
Figure 11:
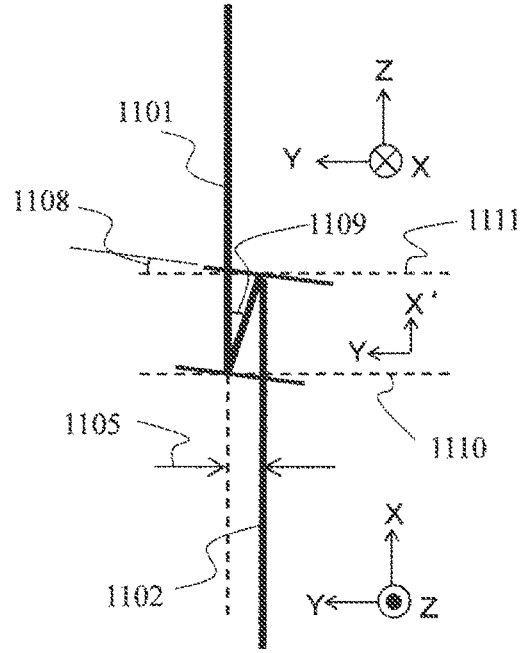

FIGS. 11(A1) and 11(A2) are views showing relations between the inclination of the penta-Dach mirror applied to the movable bender and the optical axis. When the movable bender is tilted around the Y axis by the posture error of the guide, the laser optical axis directed to the table by the action of the penta-Dach mirror moves in parallel without changing the inclination. This moving amount $\Delta$ (1103 in FIG. 11(A2)) is calculated as $\Delta = L \cdot \theta$ from a distance L (1104 in FIG. 11(A2)) between reflection points of the penta-Dach mirror, and the inclination $\theta$ (1107 in FIG. 11(A2)).

For example, if the posture error of the guide is 0.1 second and the distance between the reflection points of the penta- Dach mirror is 10 mm, the amount of parallel movement in the vertical direction of the laser optical axis directed to the table is 5 nm. The Abbe error caused by this is about 0.0025 pm according to the above Equation 1, and is understood that the level does not affect the device.

FIGS. 11(B1) and 11(B2) are views showing the optical axis misalignment when the movable bender using the penta-Dach mirror is tilted around the X axis. FIG. 11(B2) shows the misalignment of the optical axis when the penta-Dach mirror in FIG. 11(B1) is tilted around the X axis. In FIG. 11(B2), the optical axis is shown projected on a plane formed by the optical axis and the Y direction. Here, the X direction is defined as the direction of 45 degrees between the X direction and the Z direction.

The laser beam in the YZ plane travels in the XY plane after being reflected by a first reflecting surface 1110. At this time, an inclination 1109 twice as large as an inclination 1108 around the X axis of the first reflecting surface 1110 is generated around the X' axis. However, since the penta-Dach mirror 901 is an integral part, a second reflecting surface 1111 is also tilted around the X axis, so the laser optical axis moves in parallel to the X direction in the XY plane, after being reflected by the second reflecting surface 1111. At this time, the amount of parallel movement of the optical axis is calculated in the same way as the above-mentioned value, so it is negligibly small. The same applies to the case where the movable bender is tilted around the Z axis.

The same effect can be obtained even in the case of the penta-Dach prism having the same function for compensating for the inclination of the optical axis.

Meanwhile, the apparatus for measuring and inspecting the semiconductor wafer or the like may be provided with a device for measuring the height of the sample, which is referred to as a Z sensor. The Z sensor is the device that radiates laser beams onto the surface of the semiconductor wafer, and detects the reflected light using a two-dimensional sensor or the like, thus measuring the height of the sample. It is possible to measure the height of the sample according to a position where the reflected light of the two-dimensional sensor reaches. As described above, the Abbe error may be solved by adding the observation surface (sample surface) to the laser optical axis. Thus, the optical axis may be adjusted so that the position in the Z direction of the observation surface corresponds to the optical axis according to the height measurement result by the Z sensor.

Embodiment 2

Figure 12:
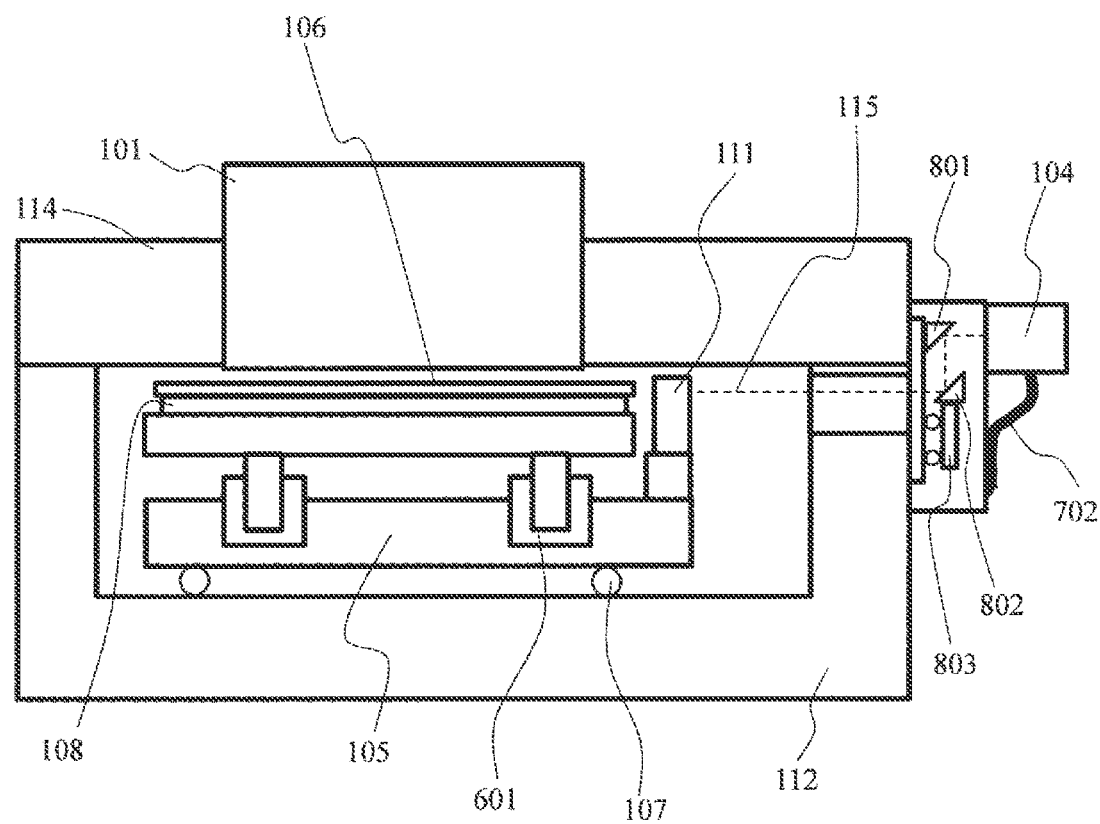
FIG. 12 is a view illustrating a configuration example in which a chuck is operated to fix the mirror.

FIG. 12 shows a configuration example where only the chuck is moved up and down by the Z mechanism, the mirror is fixed to the table and is not movable in the Z direction, the interferometer is fixed and the bender is movable. In the example of FIG. 6, the function for correcting the deflection of the electron beam is employed, the mirror and the chuck are integrally positioned by the Z mechanism to maximize the effect of correcting the vibration of the table. However, In order to alleviate the burden on the Z mechanism 601, it is also conceivable to move only the chuck 108 up and down. Even in this case, since the sample surface height varies depending on the Z axis mechanism 601, it is effective to improve the field-of-view positioning accuracy by reducing the Abbe error by moving the laser optical axis 115 up and down.

The mirror 111 is set to have a height covering the operating stroke of the Z mechanism. 601, so that it is possible to solve the problems of the vibration of the interferometer 104 and the reduction of the life of the cable 702 by adopting a configuration in which only the bender 802 is movable, in the same manner as in the configuration of FIG. 8.

Embodiment 3

Figure 13A:
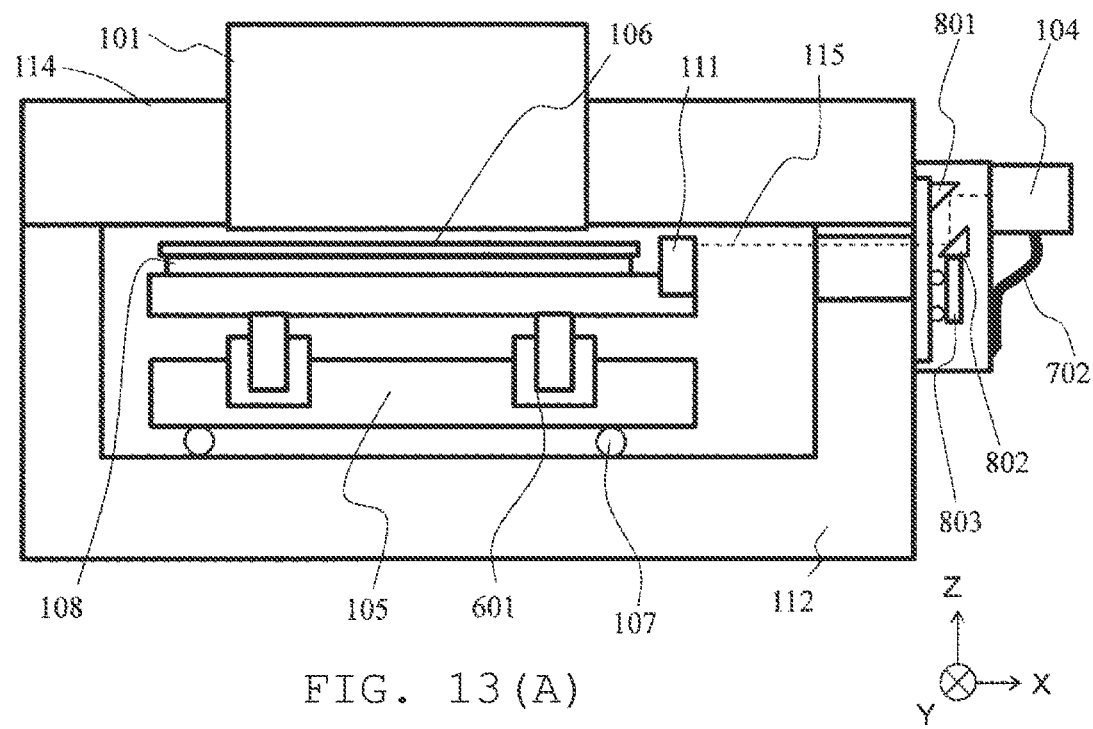
FIGS. 13(A) and 13(B) are views illustrating the switching of the effect of suppressing an error due to Abbe error and deformation.
Figure 13B:
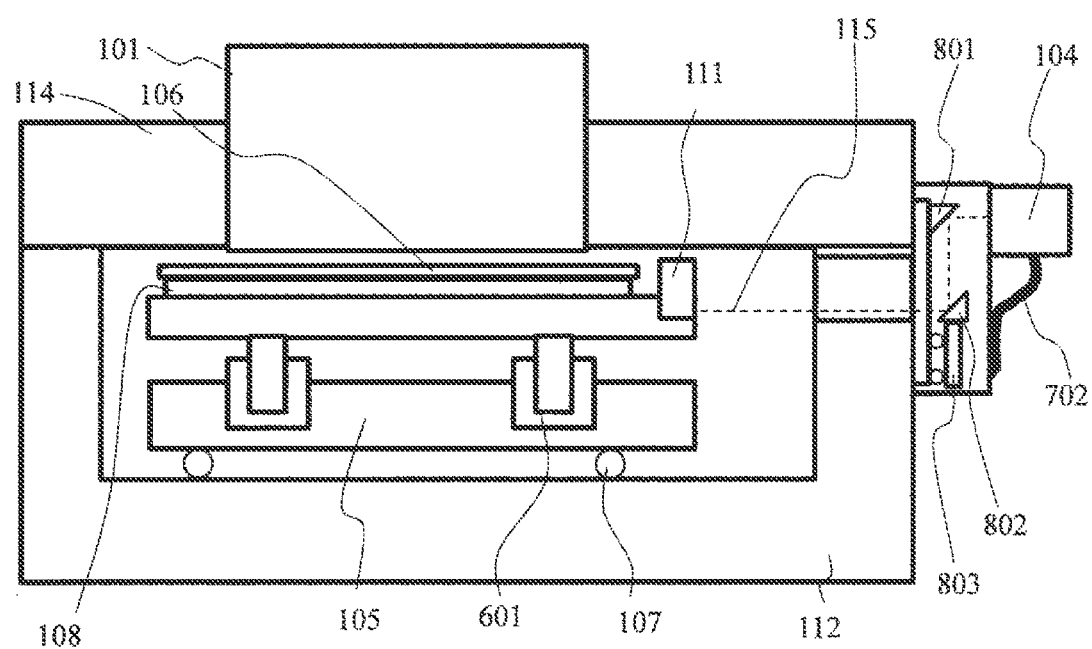

Referring to FIGS. 13(A) and 13(B), the views explain a function for switching modes of an error factor is shown. It is possible to switch between a mode for prevailingly reducing the Abbe error and a mode for prevailingly reducing the error due to the table deformation by moving only the laser optical axis of the interferometer up and down when the Z axis mechanism is at the same height.

For example, when the table deformation is large, such as when the driving distance is large or the motor generates a large amount of heat, the optical axis 115 is moved down as shown in FIG. 13(B), and the table position is measured in a state where the influence of the table deformation is small. On the contrary, when the moving distance is small, the table turns several times and the Abbe error due to the inclination change is dominant, the optical axis 115 is moved up as illustrated in FIG. 13(A) to reduce the Abbe error. In an intermediate state between the above-described two cases, the table position is measured in a state where the optical axis is set to a middle height and thus the field-of-view positioning error is expected to be minimized. Thus, by setting the interferometer optical axis to be movable, it is possible to realize a reduction in field-of-view positioning error according to the operation method of the stage.

Embodiment 4

Figure 14:
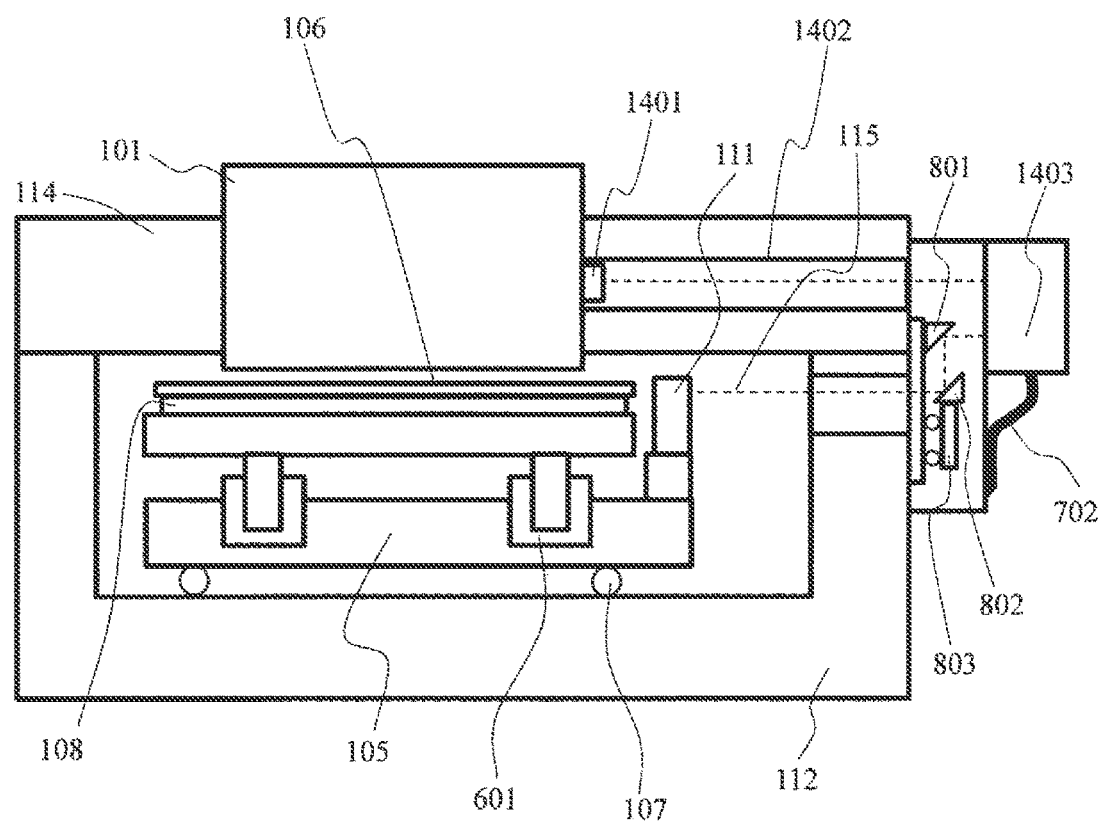
FIG. 14 is a view illustrating a configuration example in which column reference and optical-axis movement are applied.

Referring to FIG. 14, an example of a configuration for moving the interferometer optical axis in the case of a differential interferometer for measuring the position of a column is shown.

In this configuration example, a column reference mirror 1401 is attached to the electron optical system lens barrel 101 (hereinafter, column), a relative distance between the column 101 and the mirror 111 attached to the table 105 is measured by a differential interferometer 1403, it is possible to cancel influence such as the thermal expansion of the sample chamber, and it is possible to improve the field-of-view positioning accuracy.

In a top plate 114, it is necessary to form a digging 1402 in order to pass the laser optical axis for measuring the column reference mirror 1401. In this case, if the method of moving the interferometer is applied as illustrated in FIG. 7, the optical axis of a column measuring side is also moved up and down. That is, it is necessary to enlarge the digging 1402 of the top plate 114, image shaking may occur by the falling vibration of the column 101. Meanwhile, if the method of moving only the bender 802 is applied, the digging 1402 for passing the optical axis referring to the column may be minimized, so that it is possible to suppress a reduction in rigidity of the top plate 114.

Embodiment 5

Figure 15:
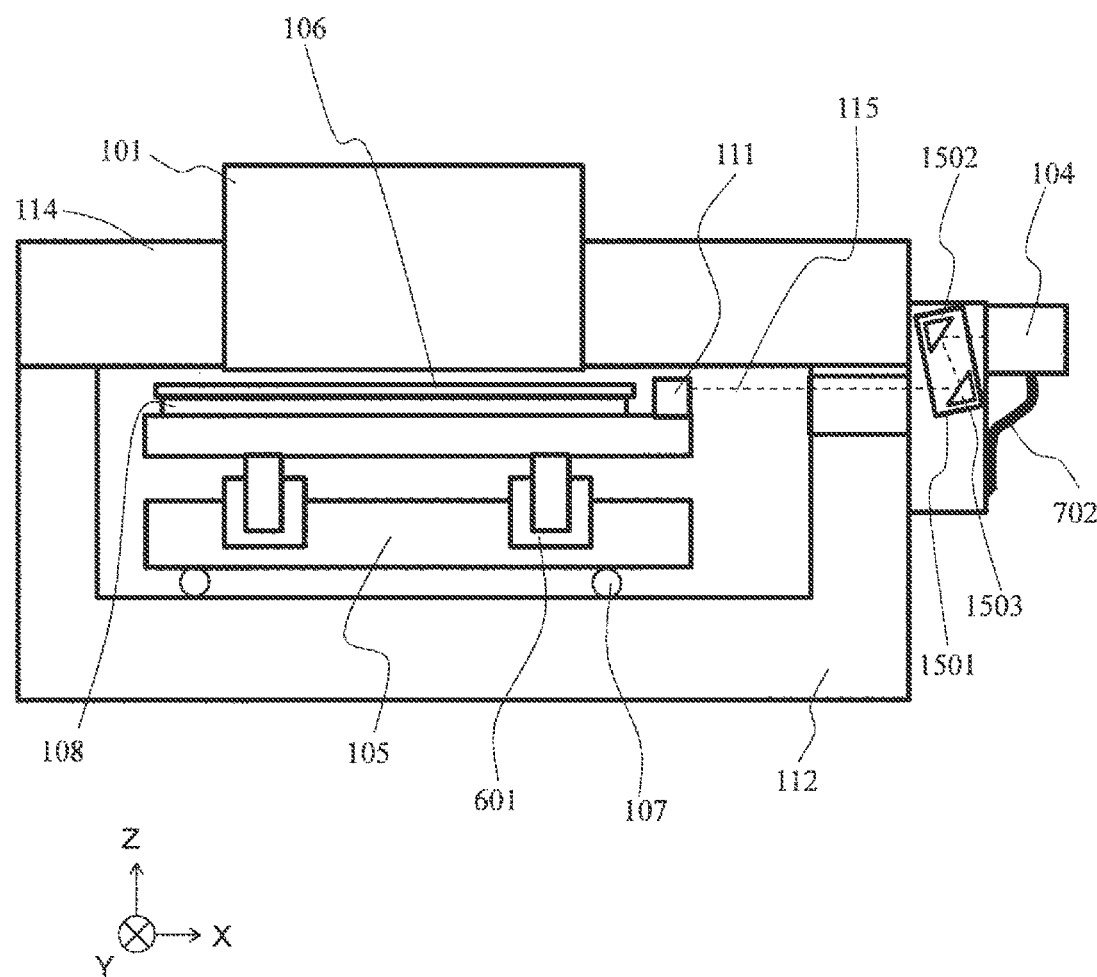
FIG. 15 is a view illustrating a configuration example in which two mirrors are integrally rotated.

Referring to FIG. 15, a configuration example where two mirrors are integrally rotated is shown. In this configuration example, in order to change the height of the laser optical axis 115, a rotary movable part 1501 to which an upper mirror 1502 and a lower mirror 1503 are fixed is tilted around the Y axis, and the parallel movement of the laser optical axis 115 in the Z direction is realized. Thus, it is possible to reduce the Abbe error by decreasing the height difference between the upper surface of the wafer 106 and the laser optical axis 115. Meanwhile, according to this embodiment, the rotary movable part 1501 corresponds to a movable mechanism to which two mirrors are fixed and which is rotatable around the Y axis. Although the rotary movable part 1501 rotatable around the Y axis for the measurement in the X-axis direction has been described in this embodiment, the rotary movable part 1501 rotatable around the X axis is employed in the case of performing the measurement in the Y-axis direction.

Figure 16:
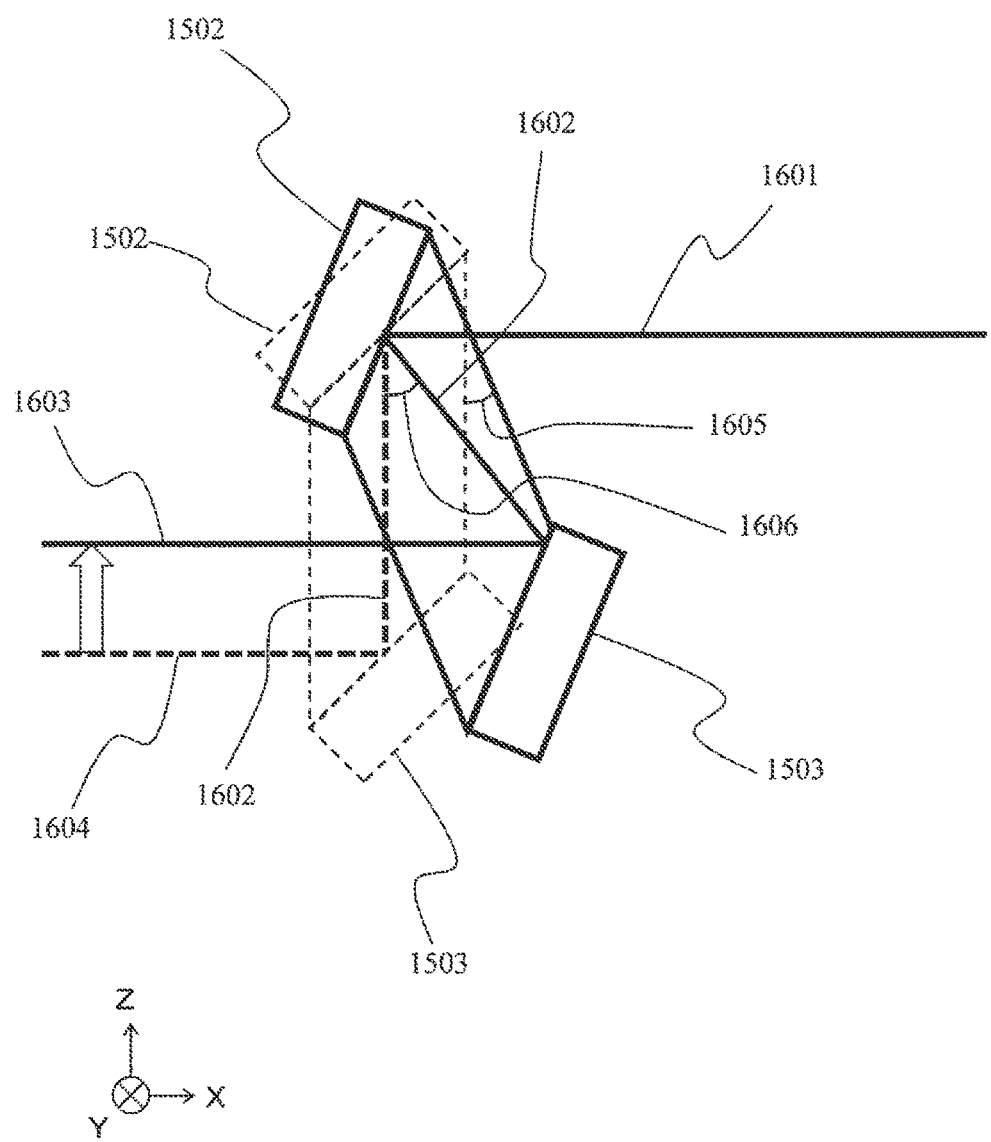
FIG. 16 is a view explaining a change in height of the optical axis by the rotation of a rotary movable part.

Referring to FIG. 16, the principle of changing the height of the optical axis by the rotation of the rotary movable part will be described.

An inclination angle 1606 twice as large as an angle 1605 is generated on an optical axis 1602 reflected by the upper mirror 1502, with respect to the inclination angle 1605 of the rotary movable part to which the upper mirror 1502 and the lower mirror 1503 are fixed. Thereby, it is possible to move the optical axis 1604 to the height of the optical axis 1603 with a small operation angle.

In FIG. 16, the rotation axis of the rotary movable part is set as the reflection point of the optical axis of the upper mirror, but the rotation axis of the rotary movable part may be formed anywhere. It is preferable that the position of the rotation axis coincide with the center of the rotary movable part. This makes it possible to minimize the fluctuation of the laser length measurement value due to rotational vibration around the rotation axis of the rotary movable part in the case of disturbance.

Figure 17:
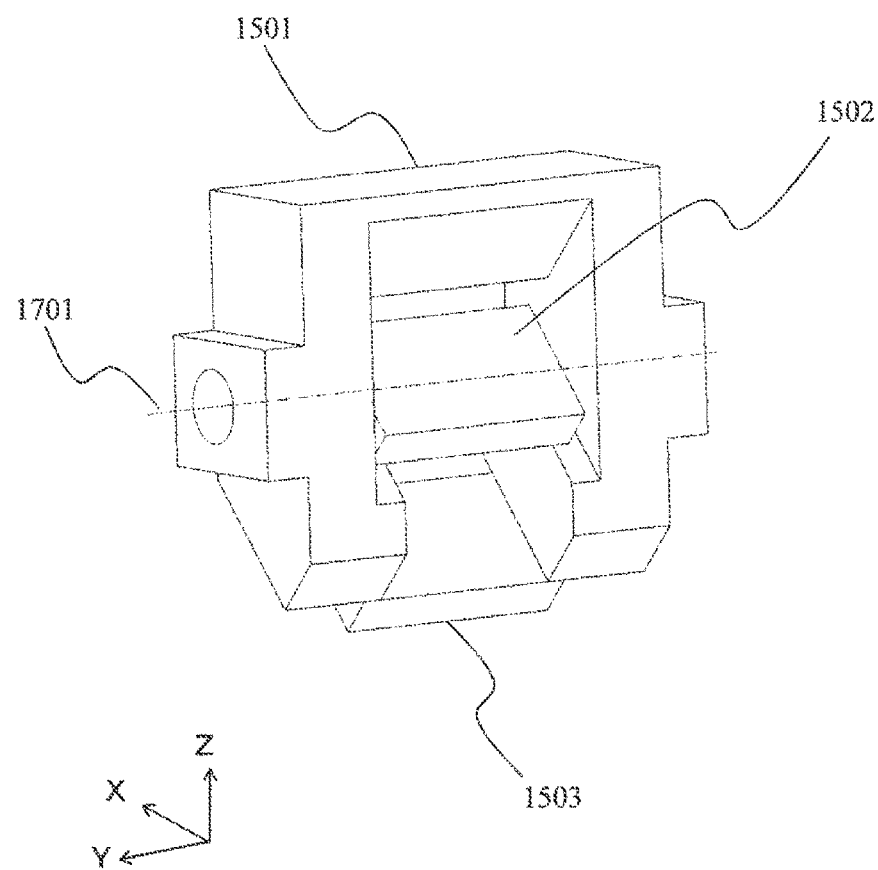
FIG. 17 is a view illustrating the example of a shape of the rotary movable part for fixing the mirror.

Next, referring to FIG. 17, the shape example of the rotary movable part for fixing the mirror is shown. It is preferable that the upper mirror 1502 and the lower mirror 1503 fix the surface on which the laser light is reflected to the rotary movable part 1501 with an adhesive surface and the rotary movable part 1501 is made of a low thermal expansion material such as invar material. With such fixation, even when the temperature of the device changes and the thicknesses of the upper mirror 1502 and the lower mirror 1503 change due to thermal expansion, the length of the optical axis 1602 in FIG. 16 is not affected. Further, since the thermal deformation of the rotary movable part is small because it uses a low thermal expansion material, it is possible to suppress the change in optical path length to a small value. Invar materials, super invar materials, glass ceramic materials, and the like may be used as the low expansion materials.

Meanwhile, a rotation center 1701 of the rotary movable part 1501 preferably rotates about an axis passing through the center of the device including the upper mirror 1502 and the lower mirror 1503, the rotary movable part 1501, and other parts rotating integrally with the rotary movable part. By arranging the rotation center in this way, it is possible to reduce the rotational vibration of the rotary movable part when the excitation force corresponding to acceleration/deceleration from the stage acts as the disturbance input, in addition to suppressing the fluctuation of the laser length measurement value.

Figure 18A:
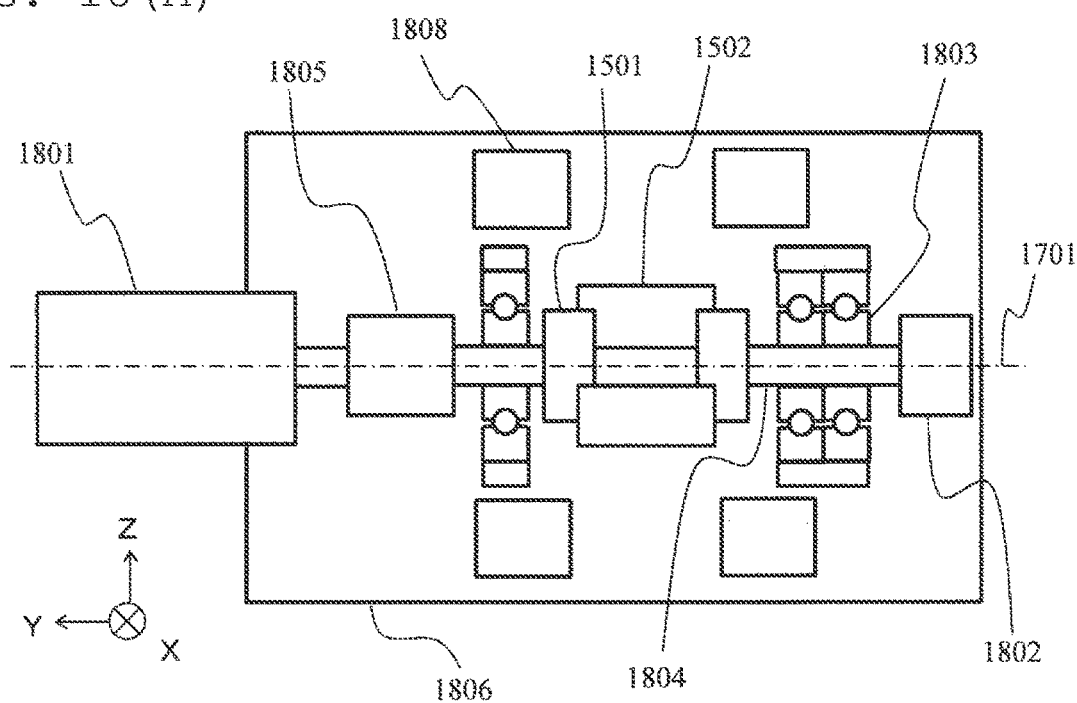
FIGS. 18(A) and 18(B) are views illustrating a configuration example in which an electromagnetic motor and an electromagnetic brake are applied.
Figure 18B:
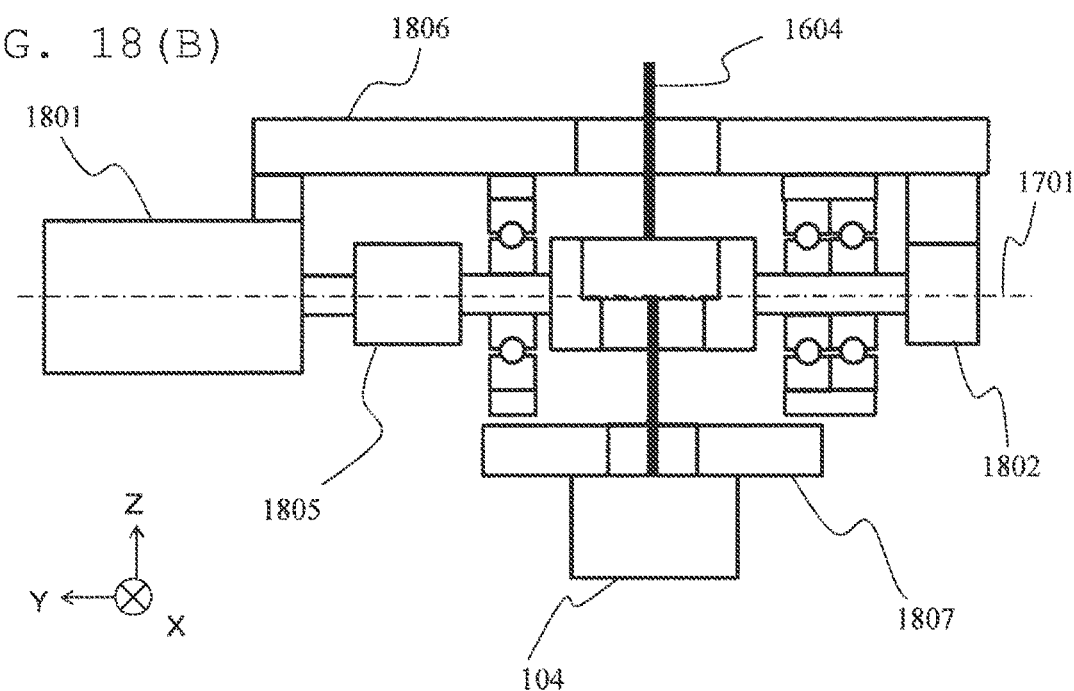

Next, referring to FIGS. 18(A) and 18(B), the configuration example where an electromagnetic motor is applied to the actuator and an electromagnetic brake is applied to fix the movable part is shown. In this configuration example, the rotary movable part 1501 is rotated by the electromagnetic motor 1801. The electromagnetic motor 1801 prevents minute vibration from being transmitted from the electromagnetic motor 1801 to the rotary movable part 1501 by turning off the excitation after the rotation.

The interferometer 104 is fixed to an interferometer base 1807, and supports the interferometer base 1807 by a support post 1808.

If the low thermal expansion material is used for the support post 1808, it is suppress the fluctuation of the laser length measurement value by the movement of the interferometer 104 in the X direction. Alternatively, as illustrated in FIG. 14, by using the differential interferometer 1403 for the interferometer 104, it is possible to cancel the movement in the X direction of the interferometer 104 due to the thermal expansion of the support post 1808.

In order to increase the rigidity of the rotary movable part 1501 around the rotation axis 1701, the electromagnetic brake 1802 may be installed. Further, when the electromagnetic motor 1801 is a motor with an electromagnetic brake, higher rigidity can be realized.

By using a coupling 1805, the rotary movable part 1501 may be smoothly rotated. However, it is preferable that the coupling 1805 is selected to have higher rigidity so as not to lower the rotational rigidity of the movable part 1501.

A shaft 1804 is supported by a bearing 1803. By arranging two bearings 1803 next to each other and applying opposing preloads, it is possible to improve the rigidity in the Y direction and the Z direction of the movable part 1501 fixed to the shaft 1804.

By using a highly damping material such as a damping alloy or a ceramic material for the shaft 1804, it is possible to momentarily attenuate rotational vibration around the Y axis of the movable portion 1501.

Figure 19A:
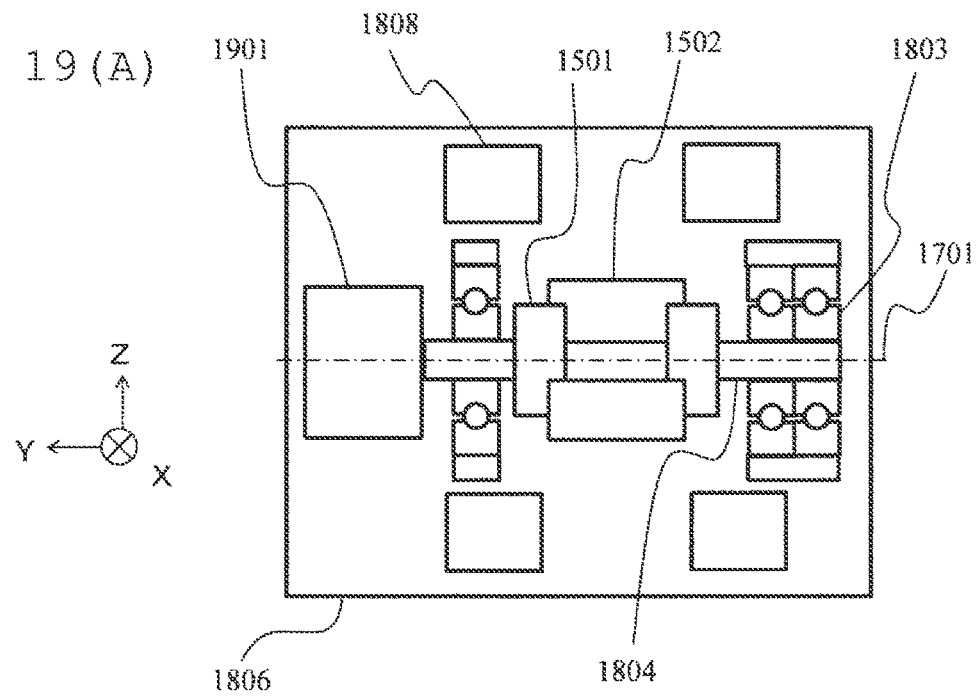
FIGS. 19(A) and 19(B) are views illustrating a configuration example in which an ultrasonic motor is applied.
Figure 19B:
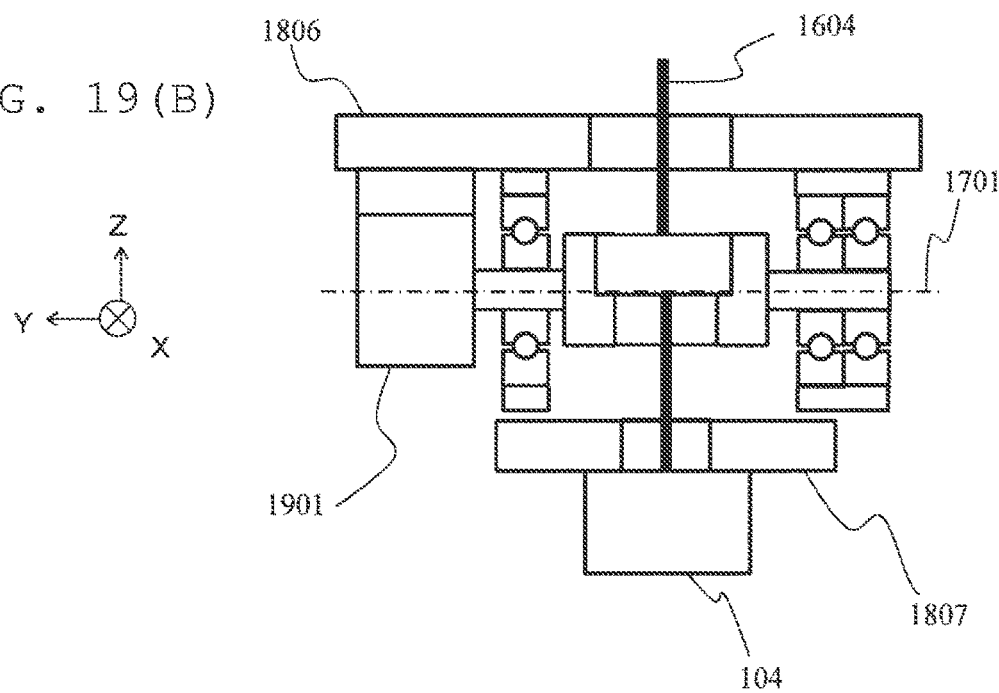

Next, referring to FIGS. 19(A) and 19(B), the configuration example where an ultrasonic motor is applied to the actuator. The ultrasonic motor 1901 is substituted for the electromagnetic motor of FIGS. 18(A) and 18(B), and the electromagnetic brake of FIGS. 18(A) and 18(B) may be omitted. Since the ultrasonic motor has high rigidity in the rotating direction and high damping ability, the rotational vibration of the movable part may be suppressed. Further, since the motor with the brake or the ultrasonic motor may retain the holding force even when the power supply is cut off, it is possible to hold the rotary movable part 1501 without generating heat, to prevent the thermal expansion of the rotary movable part 1501 due to the heat generation of the actuator and to suppress the fluctuation of the measured length value.

Figure 20A:
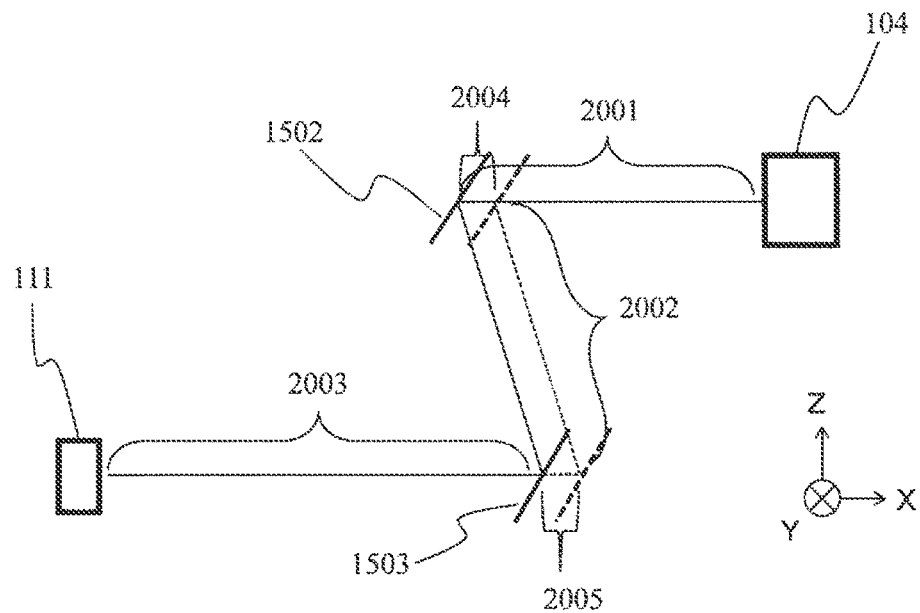
FIGS. 20 A) and 20(B) are views explaining the principle of canceling a change in optical path length when the movable part is drifted.
Figure 20B:
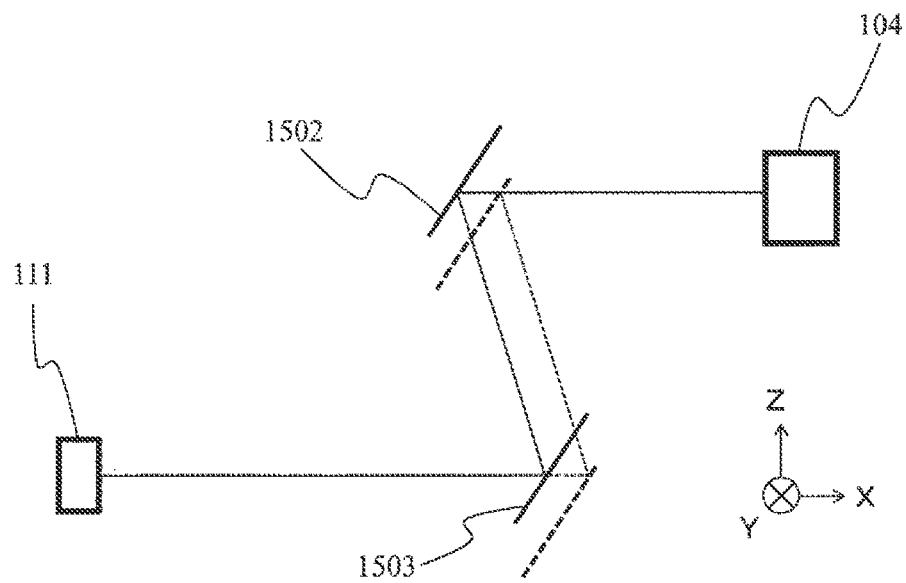

Referring to FIGS. 20(A) and 20(B), the principle of canceling a change in optical path length when the rotary movable part is drifted by the thermal deformation of a support part of the movable part will be described. In the method of embodiment 5 where two mirrors are integrally rotated, even when the bearing 1803 for supporting the movable part 1501 is thermally deformed and the position of the movable part 1501 is changed, it is possible to suppress the fluctuation of the length measurement value.

Referring to FIGS. 20(A) and 20(B), the principle of canceling a change in optical path length when the movable part is drifted will be described. As illustrated in FIG. 20(A), when the upper mirror 1502 and the lower mirror 1503 move integrally in the horizontal direction, the optical path length 2001 from the interferometer to the upper mirror contracts by a length 2004, and the optical path length from the lower mirror 2005 to the stage mirror 111 extends by a length 2005. Since the distance between the upper mirror 1502 and the lower mirror 1503 does not change, the optical path length from the interferometer to the stage mirror does not change, and the fluctuation of the laser length measurement value is canceled. Also, as shown in FIG. 20(B), even when the upper mirror 1502 and the lower mirror 1503 integrally move in the vertical direction, the optical path length changes in the same manner, so that the laser length measurement value does not fluctuate. That is, in Figs. FIGS. 18(A) and 19(A), even if the rotary movable part 1501 moves in the X direction or the Z direction due to the thermal expansion of the bearing 1803 or the like, the laser length measurement value is not changed, and the position measurement error of the table may be suppressed.

REFERENCE SIGNS LIST

- 101: electron optical system lens barrel
- 104: laser interferometer
- 105: table
- 106: wafer
- 107: guide
- 108: chuck
- 109: controller
- 111: stage mirror
- 112: sample chamber
- 113: vibration isolation mount
- 114: top plate
- 115: laser interferometer optical axis
- 201: electron beam
- 202: relative distance between mirror and observation point
- 203: field-of-view misalignment
- 204: observation target point
- 301: measurement and observation target
- 302: Abbe offset
- 303: inclination
- 304: Abbe error
- 305: observation target point
- 306: beam radiation point
- 601: Z mechanism
- 701: interferometer driving mechanism
- 702: interferometer cable
- 801: fixed bender
- 802: movable bender
- 803: bender driving mechanism
- 901: penta-Dach mirror
- 902: ultrasonic actuator
- 903: Linear Guide
- 1001: penta-Dach prism
- 1101: laser optical axis descending from fixed bender
- 1102: laser optical axis directed to table measurement
- 1103: optical axis misalignment in Z direction
- 1104: distance between reflection points
- 1105: optical axis misalignment in Y direction
- 1107: inclination of bender around Y-axis
- 1108: inclination of bender around X-axis
- 1109: inclination of optical axis
- 1110: first reflecting surface
- 1111: second reflecting surface
- 1401: column reference mirror
- 1402: digging for column reference optical path
- 1403: differential interferometer
- 1501: rotary movable part
- 1502: upper mirror
- 1503: lower mirror
- 1601: optical axis from interferometer
- 1602: optical axis bendable with upper mirror
- 1603: optical axis directed to stage
- 1604: optical axis directed to stage
- 1605: rotation angle of movable part
- 1606: rotation angle of optical axis
- 1701: rotation axis of rotary movable part
- 1801: motor
- 1802: electromagnetic brake
- 1803: bearing
- 1804: shaft
- 1805: coupling
- 1806: base
- 1807: interferometer base
- 1808: interferometer base support post
- 1901: ultrasonic motor
- 2001: optical path length from interferometer to movable part
- 2002: optical path length between mirrors
- 2003: optical path length from lower mirror to stage mirror
- 2004: optical path length decrement
- 2005: optical path length increment

The invention claimed is:

1. A stage device comprising:
   a table loaded with a sample;
   a first actuator or motor configured to move the table in an X direction;
   a mirror mounted on the table;
   a laser interferometer radiating a laser beam towards the mirror and receiving reflected light from the mirror to measure a position of the table in the X direction;
   a second actuator or motor configured to move the table in a Z direction; and
   an optical axis actuator or motor configured to move an optical axis of the laser interferometer in the Z direction.

2. The stage device of claim 1, wherein
   the optical axis actuator or motor moves the laser interferometer in the Z direction.

3. The stage device of claim 1, wherein
   the laser interferometer includes a reflection member that reflects the laser beam from a light source of the laser interferometer towards the mirror, and the optical axis actuator or motor changes a relative position in the Z direction with respect to the light source of the laser interferometer of the reflection member.

4. The stage device of claim 3, wherein
   the reflection member is a bender mirror.

5. The stage device of claim 3, wherein
   the reflection member is a penta-Dach mirror.

6. The stage device of claim 3, wherein
   the reflection member is a penta-Dach prism.

7. The stage device of claim 1, wherein
   the table is provided with an electrostatic chuck to support the sample.

8. The stage device of claim 1, further comprising:
   a controller configured to supply drive signals to the second actuator or motor and the optical axis actuator or motor.

9. The stage device of claim 1, further comprising:
   a controller configured to supply drive signals to the second actuator or motor and the optical axis actuator or motor so that a Z-direction position of a surface of the sample loaded on the table coincides with a Z-direction position of the optical axis.

10. The stage device of claim 1, wherein
    at least two mirrors are provided to reflect the laser beam from a light source of the laser interferometer towards the mirror mounted on the table, and
    the two mirrors are fixed to the optical axis actuator or motor and the optical axis actuator or motor is rotatable around an axis perpendicular to a Z direction.

11. The stage device of claim 10, wherein
a low thermal expansion material is used for the optical axis actuator or motor.

12. The stage device of claim 10, wherein
a rotation center of the two mirrors is aligned with a center of the optical axis actuator or motor.

13. The stage device of claim 10, wherein
a highly damping material is used for a shaft supporting the optical axis actuator or motor.

14. The stage device of claim 10, wherein
the optical axis actuator or motor is a motor with a brake or an ultrasonic motor.

15. A charged particle beam device comprising:
a charged particle beam barrel that radiates a charged particle beam; and
a stage moving a sample that is to be radiated with the charged particle beam,
wherein the stage includes:
a table loaded with a sample,
a first actuator or motor that moves the table in an X direction,
a mirror mounted on the table,
a laser interferometer that radiates a laser beam towards the mirror and receiving reflected light from the mirror to measure a position of the table in the X direction,
a second actuator or motor that moves the table in a Z direction, and
an optical axis actuator or motor that moves an optical axis of the laser interferometer in the Z direction.

16. The charged particle beam device of claim 15, further comprising:
a controller configured to supply drive signals to the second actuator or motor and the optical axis actuator or motor.

17. The charged particle beam device of claim 15, further comprising:
a controller configured to supply drive signals to the second actuator or motor and the optical axis actuator or motor so that a Z-direction position of a surface of the sample loaded on the table coincides with a Z-direction position of the optical axis.

* * * * *